(12) United States Patent
Chen et al.

(10) Patent No.: US 8,557,637 B2
(45) Date of Patent: Oct. 15, 2013

(54) METHOD FOR FABRICATING THE FLEXIBLE ELECTRONIC DEVICE

(75) Inventors: Kuang-Jung Chen, Hsinchu (TW); Isaac Wing-Tak Chan, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/529,820

(22) Filed: Jun. 21, 2012

(65) Prior Publication Data

US 2013/0011969 A1    Jan. 10, 2013

(30) Foreign Application Priority Data

Jul. 4, 2011 (TW) ............................ 100123479
Dec. 22, 2011 (TW) ............................ 100147906

(51) Int. Cl.
*H01L 21/00* (2006.01)
*H01L 21/30* (2006.01)

(52) U.S. Cl.
USPC ............. 438/113; 438/27; 438/458; 438/149; 438/30; 438/459; 438/462; 438/464; 438/68

(58) Field of Classification Search
USPC .................. 438/458, 459, 462, 464
See application file for complete search history.

(56) References Cited

U.S. PATENT DOCUMENTS

| | | |
|---|---|---|
| 4,473,424 A | 9/1984 | Sorko-Ram |
| 5,204,206 A | 4/1993 | Iwase et al. |
| 5,374,469 A | 12/1994 | Hino et al. |
| 5,565,303 A | 10/1996 | Shaw et al. |
| 5,821,138 A | 10/1998 | Yamazaki et al. |
| 6,340,526 B1 | 1/2002 | Inno et al. |
| 6,343,550 B1 | 2/2002 | Feesler |
| 6,517,659 B1 | 2/2003 | VanderWerf et al. |
| 6,627,518 B1 | 9/2003 | Inoue et al. |

(Continued)

FOREIGN PATENT DOCUMENTS

| | | |
|---|---|---|
| TW | 362266 | 6/1999 |
| TW | 200617473 | 6/2006 |

(Continued)

OTHER PUBLICATIONS

Burkard et al., "Large panel, highly flexible multilayer thin film boards," EU 6th Framework Program, 2009, 6 pages. Eltawahni et al., "Effect of process parameters and optimization of CO2 laser cutting of ultra high-performance polyethylene," Materials and Design, vol. 31, 2010, pp. 4029-4038.
O'Rourke et al., "Direct Fabrication of a-Si:H Thin Transistor Arrays on Plastic and Metal Foils for Flexible Displays," Army Research Laboratory, Dec. 2008, pp. 1-5.

(Continued)

*Primary Examiner* — Zandra Smith
*Assistant Examiner* — Sophia Nguyen
(74) *Attorney, Agent, or Firm* — Birch, Stewart, Kolasch & Birch, LLP

(57) ABSTRACT

The disclosure provides a method for fabricating the flexible electronic devices, including: providing a first rigid carrier substrate and a second rigid carrier substrate, wherein at least one flexible electronic device is formed between the first rigid carrier substrate and the second rigid carrier substrate, and a plurality of first de-bonding areas, a first flexible substrate, the flexible electronic device, a second flexible substrate, a plurality of second de-bonding areas and the second rigid carrier substrate are formed on the first rigid carrier substrate; performing a first cutting step to cut through the first de-bonding areas; separating the first rigid carrier substrate from the first de-bonding areas; removing the first rigid carrier substrate from the first de-bonding areas; and performing a second cutting step to cut through the second de-bonding areas; separating and removing the second rigid carrier substrate from the second de-bonding areas.

26 Claims, 23 Drawing Sheets

(56) References Cited

U.S. PATENT DOCUMENTS

| | | | |
|---|---|---|---|
| 6,776,847 B2 | 8/2004 | Yamazaki et al. | |
| 6,807,328 B2 | 10/2004 | Farah | |
| 6,846,703 B2 | 1/2005 | Shimoda et al. | |
| 6,916,681 B2 | 7/2005 | Asano et al. | |
| 6,998,282 B1 | 2/2006 | Yamazaki et al. | |
| 7,045,438 B2 | 5/2006 | Yamazaki et al. | |
| 7,105,448 B2 | 9/2006 | Takayama et al. | |
| 7,129,102 B2 | 10/2006 | Yamazaki | |
| 7,144,422 B1 | 12/2006 | Rao | |
| 7,179,693 B2 | 2/2007 | Asano et al. | |
| 7,228,968 B1 | 6/2007 | Burgess | |
| 7,229,900 B2 * | 6/2007 | Takayama et al. | 438/458 |
| 7,271,076 B2 | 9/2007 | Yamazaki et al. | |
| 7,279,401 B2 | 10/2007 | Wong et al. | |
| 7,335,573 B2 | 2/2008 | Takayama et al. | |
| 7,351,300 B2 | 4/2008 | Takayama et al. | |
| 7,361,573 B2 | 4/2008 | Takayama et al. | |
| 7,417,523 B2 | 8/2008 | Waffenschmidt et al. | |
| 7,436,032 B2 | 10/2008 | Kato | |
| 7,466,390 B2 | 12/2008 | French et al. | |
| 7,512,297 B2 | 3/2009 | Farah | |
| 7,532,378 B2 | 5/2009 | Tanaka et al. | |
| 7,534,700 B2 | 5/2009 | Yamazaki et al. | |
| 7,550,326 B2 | 6/2009 | Asano et al. | |
| 7,557,367 B2 | 7/2009 | Rogers et al. | |
| 7,566,010 B2 | 7/2009 | Yamazaki et al. | |
| 7,566,950 B2 | 7/2009 | Huang et al. | |
| 7,600,641 B2 | 10/2009 | Burgess | |
| 7,622,367 B1 | 11/2009 | Nuzzo et al. | |
| 7,632,721 B2 | 12/2009 | Yamazaki et al. | |
| 7,666,722 B2 | 2/2010 | Koyama | |
| 7,709,159 B2 | 5/2010 | Umetsu et al. | |
| 7,761,966 B2 | 7/2010 | Namburi et al. | |
| 7,789,236 B2 | 9/2010 | Burgess | |
| 7,790,469 B2 | 9/2010 | Wang et al. | |
| 7,799,699 B2 | 9/2010 | Nuzzo et al. | |
| 7,825,002 B2 | 11/2010 | Takayama et al. | |
| 7,842,561 B2 | 11/2010 | Kato | |
| 7,857,229 B2 | 12/2010 | Yamazaki et al. | |
| 2003/0025118 A1 | 2/2003 | Yamazaki et al. | |
| 2003/0027369 A1 | 2/2003 | Yamazaki | |
| 2003/0032210 A1 | 2/2003 | Takayama et al. | |
| 2003/0034497 A1 | 2/2003 | Yamazaki et al. | |
| 2003/0064569 A1 | 4/2003 | Takayama et al. | |
| 2003/0124764 A1 | 7/2003 | Yamazaki et al. | |
| 2004/0206953 A1 | 10/2004 | Morena et al. | |
| 2005/0133790 A1 | 6/2005 | Kato | |
| 2005/0146006 A1 | 7/2005 | Yamazaki et al. | |
| 2005/0148121 A1 | 7/2005 | Yamazaki et al. | |
| 2005/0173084 A1 | 8/2005 | Doublet | |
| 2005/0187487 A1 | 8/2005 | Azizkhan et al. | |
| 2005/0280531 A1 | 12/2005 | Fadem et al. | |
| 2005/0282357 A1 | 12/2005 | Takayama et al. | |
| 2005/0287846 A1 | 12/2005 | Dozen et al. | |
| 2006/0027817 A1 | 2/2006 | Yamazaki et al. | |
| 2006/0056759 A1 | 3/2006 | Farah | |
| 2006/0109414 A1 | 5/2006 | Liao et al. | |
| 2006/0166111 A1 | 7/2006 | Umetsu et al. | |
| 2006/0254704 A1 | 11/2006 | Seo et al. | |
| 2007/0032089 A1 | 2/2007 | Nuzzo et al. | |
| 2007/0054440 A1 | 3/2007 | Hu et al. | |
| 2007/0062639 A1 * | 3/2007 | Chang et al. | 156/291 |
| 2007/0114621 A1 | 5/2007 | Wisnudel et al. | |
| 2007/0161149 A1 | 7/2007 | Lin et al. | |
| 2007/0161159 A1 | 7/2007 | Yamazaki et al. | |
| 2007/0171953 A1 | 7/2007 | Shur et al. | |
| 2007/0184639 A1 | 8/2007 | Tanaka et al. | |
| 2007/0184670 A1 | 8/2007 | Koyama | |
| 2007/0195834 A1 | 8/2007 | Tanaka et al. | |
| 2007/0197049 A1 | 8/2007 | Tanaka et al. | |
| 2007/0209959 A1 | 9/2007 | Burgess | |
| 2008/0003727 A1 * | 1/2008 | Jinbo | 438/149 |
| 2008/0050888 A1 * | 2/2008 | Garner et al. | 438/463 |
| 2008/0089637 A1 | 4/2008 | Farah | |
| 2008/0125743 A1 | 5/2008 | Yuzhakov | |
| 2008/0136021 A1 | 6/2008 | Yang | |
| 2008/0157235 A1 | 7/2008 | Rogers et al. | |
| 2008/0213688 A1 | 9/2008 | Iwasaki | |
| 2008/0243098 A1 | 10/2008 | Hewitt | |
| 2008/0258457 A1 | 10/2008 | Commander | |
| 2008/0311748 A1 | 12/2008 | Kato | |
| 2009/0019687 A1 | 1/2009 | Tseng | |
| 2009/0021277 A1 | 1/2009 | Namburi et al. | |
| 2009/0050964 A1 | 2/2009 | Dozen et al. | |
| 2009/0134422 A1 | 5/2009 | Sah | |
| 2009/0174927 A1 | 7/2009 | Shinn et al. | |
| 2009/0239320 A1 * | 9/2009 | Takayama et al. | 438/27 |
| 2009/0261173 A1 | 10/2009 | Yamazaki et al. | |
| 2009/0284374 A1 | 11/2009 | Wisnudel et al. | |
| 2009/0285083 A1 | 11/2009 | Wisnudel et al. | |
| 2009/0294803 A1 | 12/2009 | Nuzzo et al. | |
| 2009/0317639 A1 | 12/2009 | Axisa et al. | |
| 2010/0012533 A1 | 1/2010 | Burgess | |
| 2010/0018634 A1 * | 1/2010 | Takahashi et al. | 156/150 |
| 2010/0059748 A1 | 3/2010 | Yamazaki et al. | |
| 2010/0068483 A1 | 3/2010 | Leu et al. | |
| 2010/0147814 A1 | 6/2010 | Watanabe | |
| 2010/0193912 A1 | 8/2010 | Speakman | |
| 2010/0210055 A1 * | 8/2010 | Yoon et al. | 438/30 |
| 2010/0283159 A1 | 11/2010 | Lin et al. | |
| 2011/0027551 A1 | 2/2011 | Huang et al. | |
| 2011/0052836 A1 | 3/2011 | Kim et al. | |

FOREIGN PATENT DOCUMENTS

| | | |
|---|---|---|
| TW | 200625673 | 7/2006 |
| TW | I259592 B | 8/2006 |
| TW | 200712613 | 4/2007 |
| TW | 200713656 | 4/2007 |
| TW | I278694 B | 4/2007 |
| TW | I279614 B | 4/2007 |
| TW | 200727732 | 7/2007 |
| TW | I288493 B | 10/2007 |
| TW | 200740694 | 11/2007 |
| TW | 200805843 A | 1/2008 |
| TW | 200823123 A | 6/2008 |
| TW | 200824518 A | 6/2008 |
| TW | 200826254 | 6/2008 |
| TW | 200827271 A | 7/2008 |
| TW | 200834033 | 8/2008 |
| TW | 200920870 | 5/2009 |
| TW | 200924229 A | 6/2009 |
| TW | 200929457 A | 7/2009 |
| TW | 200929460 A | 7/2009 |
| TW | 200931150 A | 7/2009 |
| TW | 200936008 A | 8/2009 |
| TW | I318681 B | 12/2009 |
| TW | 201003845 A | 1/2010 |
| TW | I320963 B | 2/2010 |
| TW | 201011427 A | 3/2010 |
| TW | 201021950 A1 | 6/2010 |
| TW | 201022853 | 6/2010 |
| TW | I327450 B | 7/2010 |
| TW | I327485 B | 7/2010 |
| TW | I331885 B | 10/2010 |
| TW | 201106447 A1 | 2/2011 |
| TW | 201108906 A1 | 3/2011 |

OTHER PUBLICATIONS

Puligadda et al., "High-Performance Temporary Adhesives for Wafer Bonding Applications," Mater. Res. Soc. Symp. Proc., vol. 970, 2007, 3 pages.

Qi et al., "Micromachining of microchannel on the polycarbonate substrate with C02 laser direct-writing ablation," Optics and Lasers in Engineering, vol. 47, 2009, pp. 594-598.

Shuangwu et al., "Temporary Bonding of Wafer to Carrier for 3D-Wafer Level Packaging," 2008 10th Electronics Packaging Technology Conference, IEEE, pp. 405-411.

* cited by examiner

METHOD FOR FABRICATING THE FLEXIBLE ELECTRONIC DEVICE

CROSS REFERENCE TO RELATED APPLICATION

This Application claims priority of Taiwan Patent Application No. 100123479, filed on Jul. 4, 2011, and No. 100147906, filed on Dec. 22, 2011, the entirety of which is incorporated by reference herein.

BACKGROUND OF THE DISCLOSURE

1. Field of the Disclosure

The disclosure relates to a method for fabricating the electronic devices.

2. Description of the Related Art

Consumer electronic applications are becoming increasingly diverse with the rapid progress of science and technology. Light, thin, short and small electronic products are being demanded. Thus, flexible electronic devices are being developed.

During fabrication of the flexible electronic devices, the flexible electronic devices are firstly formed on a flexible substrate with a glass rigid carrier substrate. Then, the flexible electronic devices are taken out of the rigid carrier substrate.

U.S. Pat. No. 7,466,390 discloses a method for fabricating a thin film transistor (TFT) on a flexible substrate. An a-Si release layer is formed between a plastic substrate and a glass carrier substrate. The release layer is fused by a laser beam, and then the plastic substrate and the glass carrier substrate are separated.

U.S. Pat. No. 7,566,950 discloses a method for fabricating a flexible display device. A release layer, a polymer film and an electronic array are formed on a glass carrier substrate. The adhesive strength between the glass carrier substrate and the release layer is higher than that between the release layer and the polymer film. Thus, the glass carrier substrate and the polymer film are separated only by a curing process.

When the flexible electronic devices are fabricated by a sheet-to-sheet process, and the flexible electronic devices are formed between two rigid carrier substrates, performing a process to a surface of the flexible electronic devices and taking the flexible electronic devices out of the two rigid carrier substrates are challenges.

Therefore, there is a need to develop a method for fabricating the flexible electronic devices, wherein the flexible electronic devices may be easily taken out of the two rigid carrier substrates.

BRIEF SUMMARY OF THE DISCLOSURE

The disclosure provides a method for fabricating the flexible electronic devices, comprising: providing a first rigid carrier substrate and a second rigid carrier substrate disposed oppositely to each other, wherein at least one flexible electronic device is formed between the first rigid carrier substrate and the second rigid carrier substrate, and a plurality of first de-bonding areas, a first flexible substrate, the flexible electronic device, a second flexible substrate, a plurality of second de-bonding areas and the second rigid carrier substrate are formed on the first rigid carrier substrate; performing a first cutting step to cut through the first de-bonding areas, wherein the first de-bonding areas are divided into a first portion and a second portion, and the flexible electronic device is formed on the first portion of the first de-bonding areas; separating the first rigid carrier substrate from the first portion of the first de-bonding areas; removing the first rigid carrier substrate from the first portion of the first de-bonding areas to expose the first portion of the first de-bonding areas; and performing a second cutting step to cut through the second de-bonding areas, wherein the second de-bonding areas are divided into a third portion and a fourth portion, and the flexible electronic device is formed on the third portion of the second de-bonding areas; separating the second rigid carrier substrate from the third portion of the second de-bonding areas; and removing the second rigid carrier substrate from the third portion of the second de-bonding areas.

The disclosure also provides a method for fabricating the flexible electronic devices, comprising: providing a first rigid carrier substrate and a second rigid carrier substrate disposed oppositely to each other, wherein at least one flexible electronic device is formed between the first rigid carrier substrate and the second rigid carrier substrate, and a plurality of first de-bonding areas, a first flexible substrate, the flexible electronic device, a second flexible substrate, a plurality of second de-bonding areas and the second rigid carrier substrate are formed on the first rigid carrier substrate; performing a cutting step to cut through the first de-bonding areas and the second de-bonding areas, wherein the first de-bonding areas are divided into a first portion and a second portion, the second de-bonding areas are divided into a third portion and a fourth portion, and the flexible electronic device is formed on the first portion of the first de-bonding areas and the third portion of the second de-bonding areas; separating the second rigid carrier substrate from the third portion of the second de-bonding areas; removing the second rigid carrier substrate from the third portion of the second de-bonding areas to expose the third portion of the second de-bonding areas; separating the first rigid carrier substrate from the first portion of the first de-bonding areas; and removing the first rigid carrier substrate from the first portion of the first de-bonding areas.

The disclosure also provides a method for fabricating the flexible electronic devices, comprising: providing a second rigid carrier substrate, wherein at least one second de-bonding area, a second flexible substrate and a function layer are formed on the second rigid carrier substrate; performing a first cutting step to cut through the second de-bonding areas and the second flexible substrate, wherein the second de-bonding areas are divided into a first portion and a second portion, and the second flexible substrate is divided into a first portion and a second portion; providing a first rigid carrier substrate, wherein at least one first de-bonding area, a first flexible substrate and a plurality of the flexible electronic devices are formed on the first rigid carrier substrate; assembling the first rigid carrier substrate to the second rigid carrier; performing a second cutting step to cut through the first flexible substrate, wherein the first flexible substrate is divided into a third portion and a fourth portion, and the flexible electronic device is formed on the third portion of the first flexible substrate; performing a third cutting step to cut through the first rigid carrier substrate and the second rigid carrier substrate; performing a breakage step to form a single flexible electronic device between the first rigid carrier substrate and the second rigid carrier substrate; separating the second de-bonding areas from the second flexible substrate to expose a surface of the first portion of the second flexible substrate; performing a fourth cutting step to cut through the first de-bonding area; and separating the first de-bonding area from the third portion of the first flexible substrate.

The disclosure also provides a method for fabricating the flexible electronic devices, comprising: providing a first rigid carrier substrate, wherein at least one first de-bonding area, a first flexible substrate and a plurality of the flexible electronic devices are formed on the first rigid carrier substrate; performing a first cutting step to cut through the first de-bonding areas and the first flexible substrate, wherein the first de-bonding area is divided into a first portion and a second portion, and the first flexible substrate is divided into a first portion and a second portion; providing a second rigid carrier substrate, wherein at least one second de-bonding area, and a second flexible substrate are formed on the second rigid carrier substrate; assembling the first rigid carrier substrate to the second rigid carrier substrate; performing a second cutting step to cut through the second flexible substrate, wherein the second flexible substrate is divided into a third portion and a fourth portion, and the flexible electronic devices are formed on the third portion of the second flexible substrate; performing a third cutting step to cut through the first rigid carrier substrate and the second rigid carrier substrate; performing a breakage step to form a single flexible electronic device between the first rigid carrier substrate and the second rigid carrier substrate; separating the first de-bonding area from the first flexible substrate to expose a surface of the first portion of the first flexible substrate; performing a fourth cutting step to cut through the second de-bonding area; and separating the second de-bonding area from the second flexible substrate.

A detailed description is given in the following embodiments with reference to the accompanying drawings.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION OF THE DISCLOSURE

The following description is of the embodiment of the disclosure. This description is made for the purpose of illustrating the general principles of the disclosure and should not be taken in a limiting sense. The scope of the disclosure is best determined by reference to the appended claims.

Figure 1A:
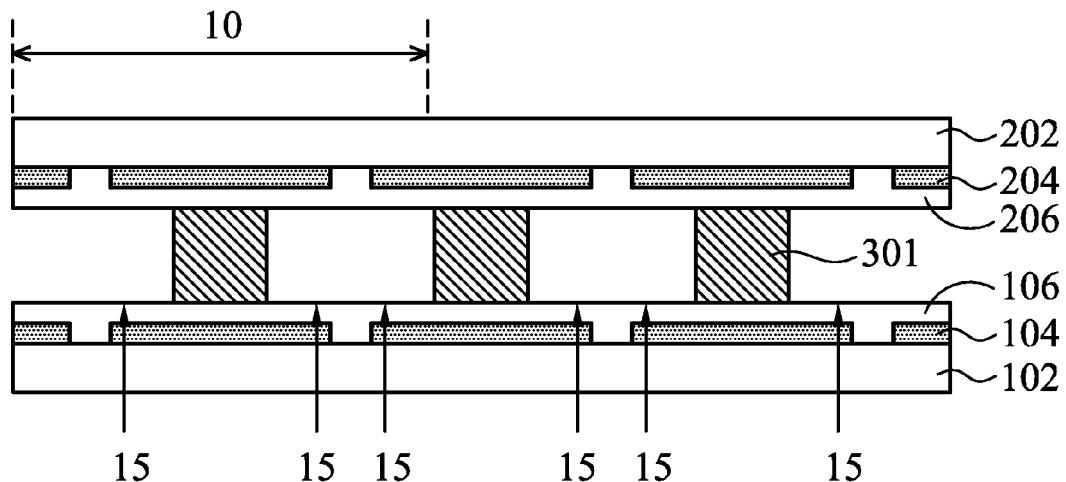
FIGS. 1A and 1C-1F show cross-sectional schematic representations of various stages of fabricating a flexible electronic device in accordance with a first embodiment of the disclosure.

FIGS. 1A and 1C-1F show cross-sectional schematic representations of various stages of fabricating a flexible electronic device in accordance with a first embodiment of the disclosure. Referring to FIG. 1A, a first rigid carrier substrate 102 and a second rigid carrier substrate 202 are disposed oppositely to each other. A plurality of first de-bonding areas 104, a first flexible substrate 106, at least one flexible electronic device 301, a second flexible substrate 206, a plurality of second de-bonding areas 204 and the second rigid carrier substrate 202 are formed on the first rigid carrier substrate 102. The flexible electronic device 301 may be a single flexible electronic device or many flexible electronic devices. The flexible electronic device 301 is formed between the first rigid carrier substrate 102 and the second rigid carrier substrate 202, and between the first flexible substrate 106 and the second flexible substrate 206. The first de-bonding areas 104 and second de-bonding areas 204 are non-continuous fragments. Thus, a portion of the first flexible substrate 106 is formed between two adjacent first de-bonding areas 104, and a portion of the second flexible substrate 206 is formed between two adjacent second de-bonding areas 204.

The first rigid carrier substrate 102 and the second rigid carrier substrate 202 independently comprise a glass substrate, silicon substrate, quartz substrate or sapphire substrate. In one embodiment, the first rigid carrier substrate 102 and the second rigid carrier substrate 202 are both transparent substrates, such as glass substrates.

The first flexible substrate 106 and the second flexible substrate 206 are plastic substrates and independently comprise polyimide (PI), polycarbonate (PC), polyethersulfone (PES), polyacrylate (PA), polynorbornene (PNB), polyetheretherketone, (PEEK), polyethylene naphthalate (PEN) or polyetherimide (PEI). In one embodiment, first flexible substrate 106 and the second flexible substrate 206 are both polyimide (PI) substrates.

The flexible electronic device 301 comprises a thin film transistor (TFT), electronic touch device, solar cell, organic light emitting diode (OLED), electronic sensor or the like. The flexible electronic device 301 is not limited to the above-mentioned kinds. Other flexible electronic devices are also included in the scope of the disclosure.

Referring to FIG. 1A again, a first cutting step 15 is performed to cut through the first de-bonding areas 104 and the first flexible substrate 106. The first de-bonding areas 104 are divided into a first portion 104a and a second portion 104b, and the first flexible substrate 106 is divided into a first portion 106a and a second portion 106b. The flexible electronic device 301 is formed on the first portion 104a of the first de-bonding areas 104, and on the first portion 106a of the first flexible substrate 106. After the first cutting step 15, a region 10 is obtained. The region 10 is illustrated in FIGS. 1C-1F.

The first cutting step 15 comprises irradiating a laser beam to the first de-bonding areas 104 and the first flexible substrate 106 through the first rigid carrier substrate 102. In one embodiment, a carbon dioxide ($CO_2$) laser is used. The wavelength of the laser is about 10640 nm, the power of the laser is smaller than 50 Watt, and the rate of the laser is about 10 mm/s-60 mm/s.

In another embodiment, an IR laser is used. The wavelength of the IR laser is about 810 nm, the power of the laser is about 0.9-10 Watt, and the rate of the laser is about 0.2 mm/s-15 mm/s. In yet another embodiment, the wavelength of the laser is about 1064 nm, and the power of the laser is about 1-20 Watt. In another embodiment, the wavelength of the laser is about 532 nm, and the power of the laser is about 1-10 Watt. In yet another embodiment, the wavelength of the laser is about 355 nm, and the power of the laser is about 0.1-10 Watt. In still another embodiment, the wavelength of the laser is about 266 nm, and the power of the laser is about 0.1-10 Watt.

Figure 1B:
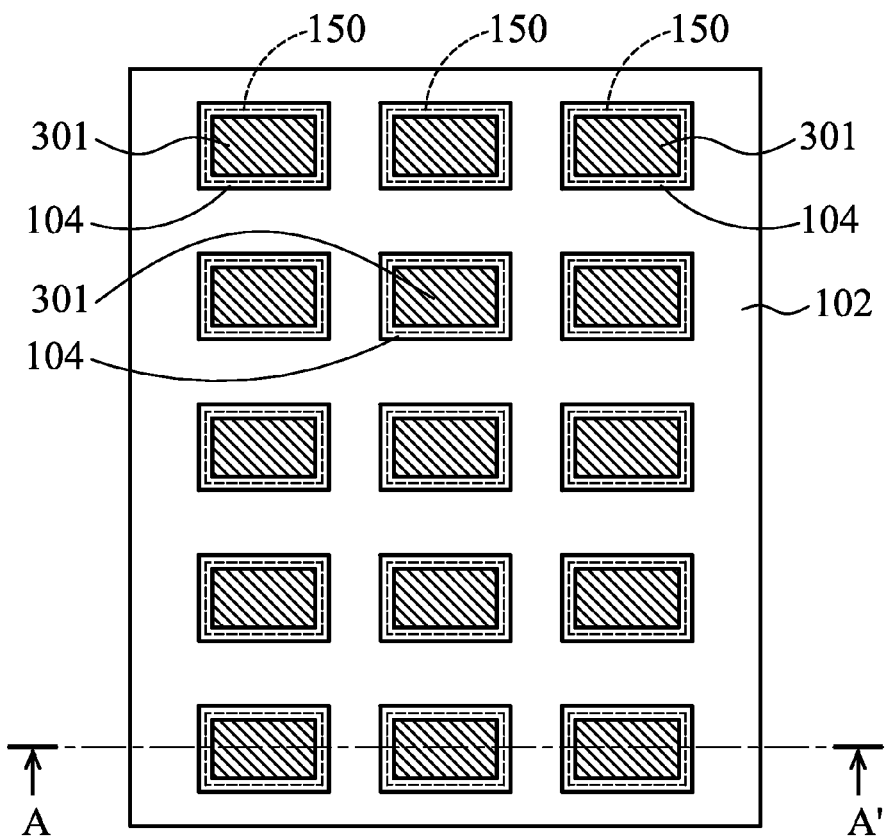
FIG. 1B shows a top-view schematic representation of a flexible electronic device of the first embodiment of the disclosure.

FIG. 1B shows a top-view schematic representation of a flexible electronic device of the first embodiment of the disclosure. FIG. 1A is the cross-sectional schematic representations along the AA' line on FIG. 1B. FIG. 1B has been simplified to only show the position of the flexible electronic device 301 and the first de-bonding areas 104. FIG. 1B shows an actual cutting path 150 of the first cutting step 15, e.g. a scribe line by a laser beam. Note that after the first cutting step 15, the first rigid carrier substrate 102 is removed, but a plurality of the flexible electronic devices 301 still remains on the second rigid carrier substrate 202. In other words, the flexible electronic devices 301 are still connected to the second rigid carrier substrate 202. For clarity, FIGS. 1C-1F only show a single flexible electronic device 301.

Figure 1C:
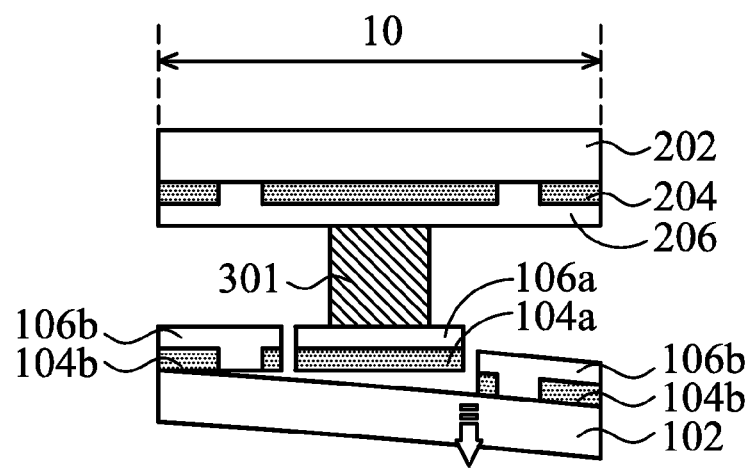

Referring to FIG. 1C, the first rigid carrier substrate 102 is separated from the first portion 104a of the first de-bonding areas 104. The first rigid carrier substrate 102, the second rigid carrier substrate 202 or both may be bendable carrier substrates. In one embodiment, the first rigid carrier substrate 102 is a bendable carrier substrate. Thus, the bendable carrier substrate may be removed by applying a small external force.

In one embodiment, the first de-bonding areas 104 and the second de-bonding areas 204 are tangible films, such as parylene, fluoro-containing polymer or the like. In another embodiment, the first de-bonding areas 104 and the second de-bonding areas 204 are intangible films. For example, the surface of the first rigid carrier substrate 102 and the second rigid carrier substrate 202 are roughened by a physical method, such as an etching, sand blast, or polishing method or the like, or are modified by a compound, such as trimethylchlorosilane, thionyl chloride or the like. Thus, when the first de-bonding areas 104 and the second de-bonding areas 204 are both tangible films, during the separation step, they may be left on the same side as the first rigid carrier substrate 102 and the second rigid carrier substrate 202, or on the same side as the first flexible substrate 106 or the second flexible substrate 206.

Figure 1D:
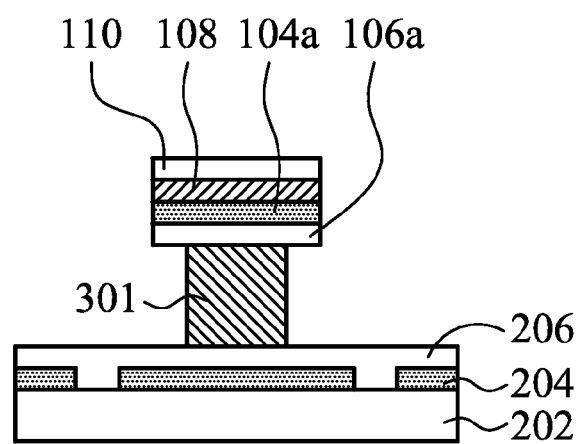

Then, referring to FIG. 1D, the first rigid carrier substrate 102 is removed from the first portion 104a of the first de-bonding areas 104 to expose the first portion 104a of the first de-bonding areas 104. Then, a process method is performed to a surface of the first portion 104a of the first de-bonding areas 104. The process method comprises adhering the function layers 108, 110 to the surface of the first portion 104a of the first de-bonding areas 104. The function layers 108, 110 comprise barrier layers, polarizer films, anti reflectance coating layers, anti-scratch protective films, or touch panels or the like. The numbers of the function layers 108, 110 are not limited to two layers. The numbers of the function layers 108, 110 may be adjusted according to the actual application of those skilled in the art.

Although the first rigid carrier substrate 102 is removed in FIG. 1D, the second rigid carrier substrate 202 still remains. Thus, the flexible electronic devices 301 are supported by the second rigid carrier substrate 202 to help the process step be performed on the surface of the first portion 104a of the first de-bonding areas 104.

Figure 1E:
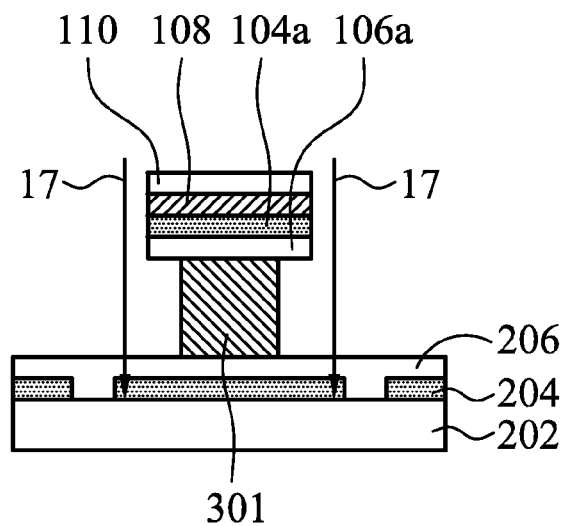

Then, referring to FIG. 1E, a second cutting step 17 is performed to cut through the second de-bonding areas 204 and the second flexible substrate 206. The second de-bonding areas 204 are divided into a third portion 204a and a fourth portion 204b, and the second flexible substrate 206 is divided into a third portion 206a and a fourth portion 206b. The flexible electronic device 301 is formed on the third portion 204a of the second de-bonding areas 204 and the third portion 206a of the second flexible substrate 206.

The second cutting step 17 comprises cutting the second de-bonding areas 204 and the second flexible substrate 206 by a laser beam or a knife wheel.

Figure 1F:
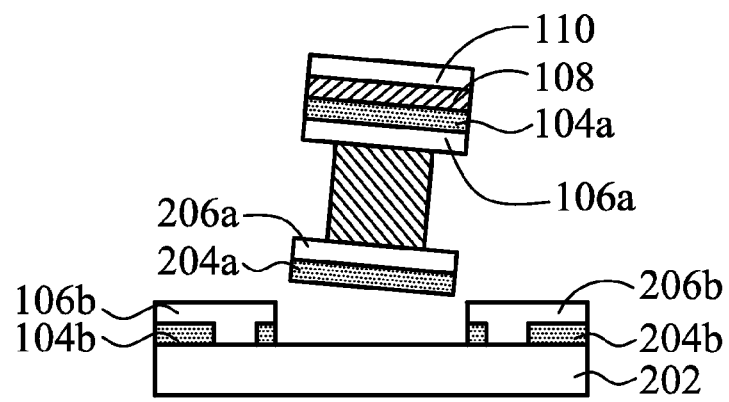

Finally, referring to FIG. 1F, the second rigid carrier substrate 202 is separated from the third portion 204a of the second de-bonding areas 204, and the second rigid carrier substrate 202 is removed from the third portion 204a of the second de-bonding areas 204. Thus, the process method of the flexible electronic device 301 is completed and the flexible electronic device 301 is taken out of the two rigid carrier substrates.

In a modified embodiment of the first embodiment, one of the first rigid carrier substrate 102 and the second rigid carrier substrate 202 is a transparent substrate, and the other is a non-transparent substrate, such as a metal substrate, or stainless steel substrate.

When one of the two rigid carrier substrates is a transparent substrate, and the other is a non-transparent substrate, the cutting step is performed from the transparent substrate side.

FIGS. 2A-2H show cross-sectional schematic representations of various stages of fabricating a flexible electronic device in accordance with a second embodiment of the disclosure, wherein like elements are identified by the same reference numbers as in FIG. 1A-1F, and thus omitted for brevity. The difference between the first embodiment and the second embodiment is that a single flexible electronic device 303 is formed between the first rigid carrier substrate 102 and the second rigid carrier substrate 202 in the second embodiment. Another difference is that a pin 120 is formed on the first flexible substrate 106 in the second embodiment. The function of the pin 120 is to transfer the signal of the single flexible electronic device 303 to an external circuit.

Figure 2A:
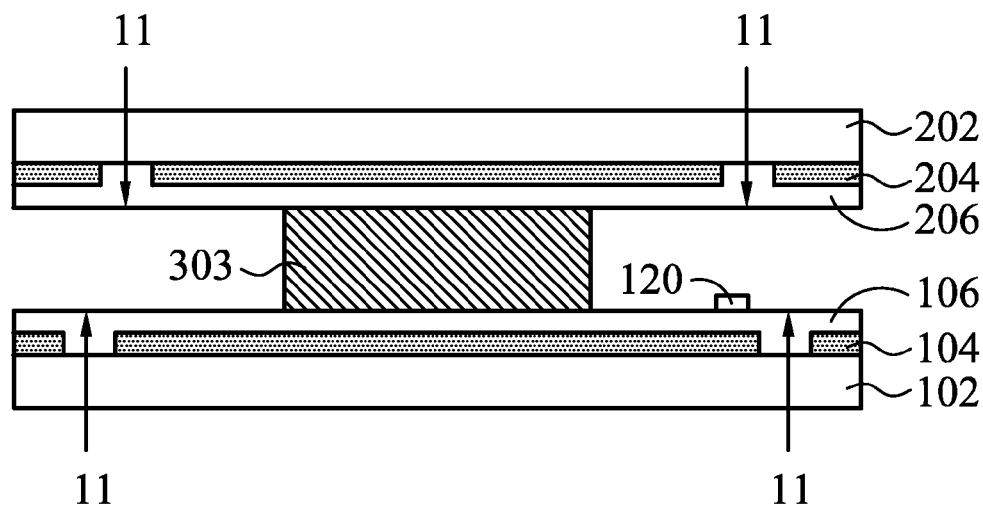
FIGS. 2A-2H show cross-sectional schematic representations of various stages of fabricating a flexible electronic device in accordance with a second embodiment of the disclosure.

Referring to FIG. 2A, the first flexible substrate 106 and the second flexible substrate 206 are cut by a laser beam 11 along an outer peripheral portion of the single flexible electronic device 303. Thus, a first breakage opening 25 is formed in the first flexible substrate 106 and a second breakage opening 27 is formed in the second flexible substrate 206.

In FIG. 2A, the laser 11 cuts through the first flexible substrate 106 and the second flexible substrate 206, but not through the first de-bonding areas 104 and the second de-bonding areas 204. Thus, in the following steps, a first cutting step 15 (in FIG. 2D) and a second cutting step 17 (in FIG. 2G) are used to remove the first rigid carrier substrate 102 and the second rigid carrier substrate 202, respectively.

Figure 2B:
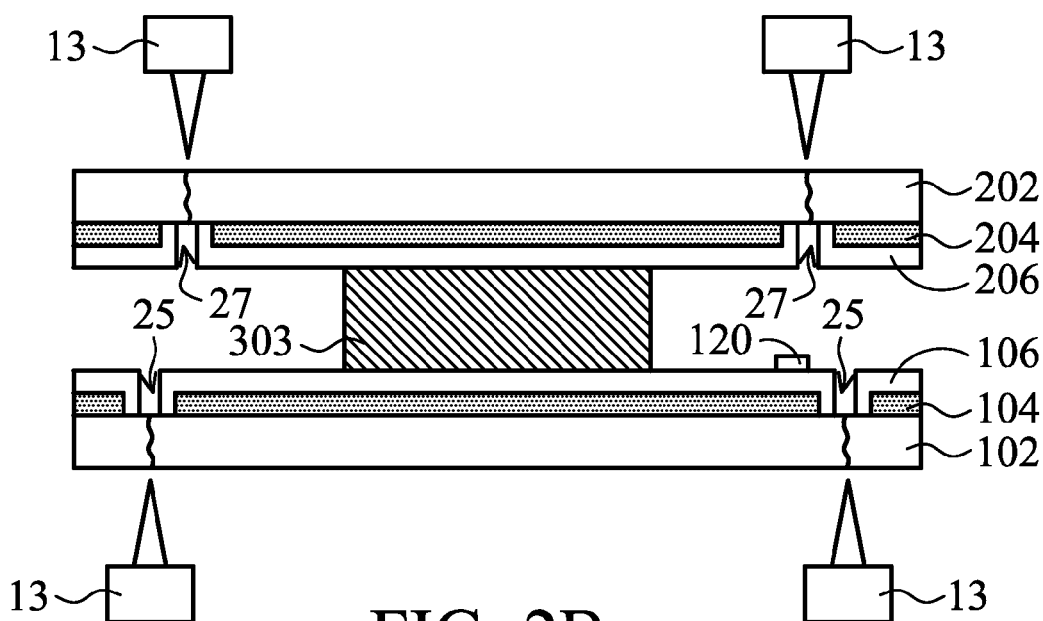

Referring to FIG. 2B, the first rigid carrier substrate 102 and the second rigid carrier substrate 202 are cut by a knife wheel 13 along a vertical direction of the first breakage opening 25 and the second breakage opening 27. A breakage step is performed to form the single flexible electronic device 303 between the first rigid carrier substrate 102 and the second rigid carrier substrate 202 (as shown in FIG. 2C).

Figure 2C:
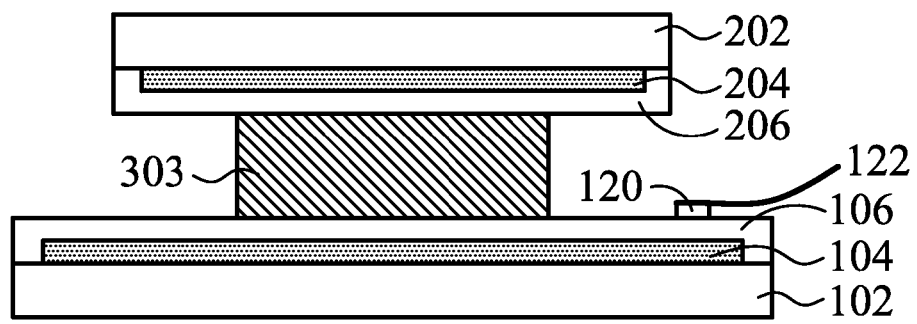

Referring to FIG. 2C, a pin 120 is formed on the first flexible substrate 106. After the breakage step, a surface of the pin 120 is exposed. Then, the exposed surface of the pin 120 is electrically connected to a flexible printed circuit board bonding (FPC bonding 122). Thus, the signal of the single flexible electronic device 303 is transferred to the external circuit by the FPC bonding.

Figure 2D:
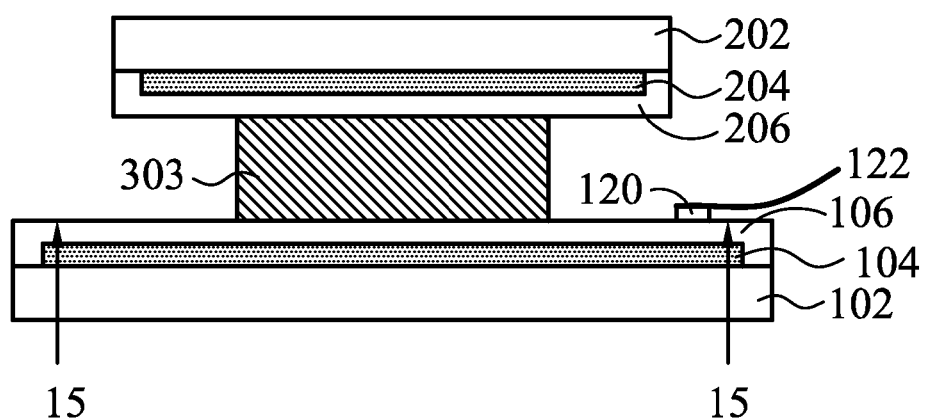

Then, referring to FIG. 2D, a first cutting step 15 is performed to cut through the first de-bonding areas 104 and the first flexible substrate 106. The first de-bonding areas 104 are divided into a first portion 104a and a second portion 104b, and the first flexible substrate 106 is divided into a first portion 106a and a second portion 106b. The single flexible electronic device 303 is formed on the first portion 104a of the first de-bonding areas 104 and the first portion 106a of the first flexible substrate 106.

The first cutting step 15 comprises irradiating a laser beam to the first de-bonding areas 104 and the first flexible substrate 106 through the first rigid carrier substrate 102.

Figure 2E:
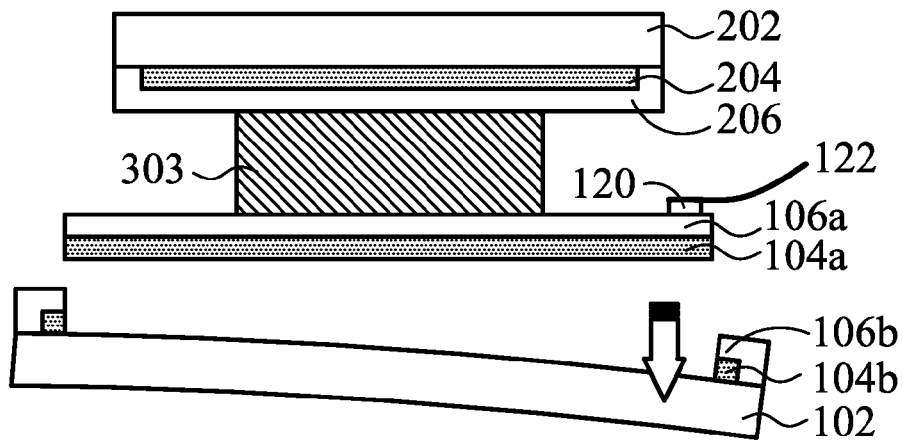

Referring to FIG. 2E, the first rigid carrier substrate 102 is separated from the first portion 104a of the first de-bonding areas 104. In an embodiment, the first rigid carrier substrate 102 is a bendable carrier substrate. Thus, the first rigid carrier substrate 102 is easily separated by applying a little force.

Figure 2F:
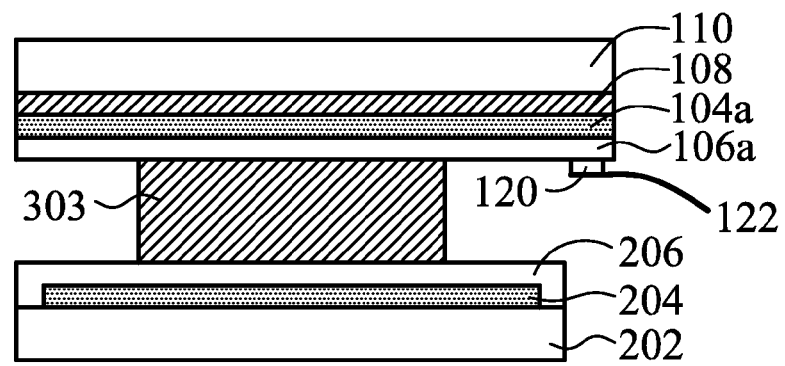

Referring to FIG. 2F, the first rigid carrier substrate 102 is removed from the first portion 104a of the first de-bonding areas 104 to expose a surface of the first portion 104a of the first de-bonding areas 104. Then, a process method is performed to the surface of the first portion 104a of the first de-bonding areas 104. The process method comprises adhering the function layers 108, 110 to a surface of the first portion 104a of the first de-bonding areas 104. The function layers 108, 110 are described above, thus are omitted here for brevity.

Figure 2G:
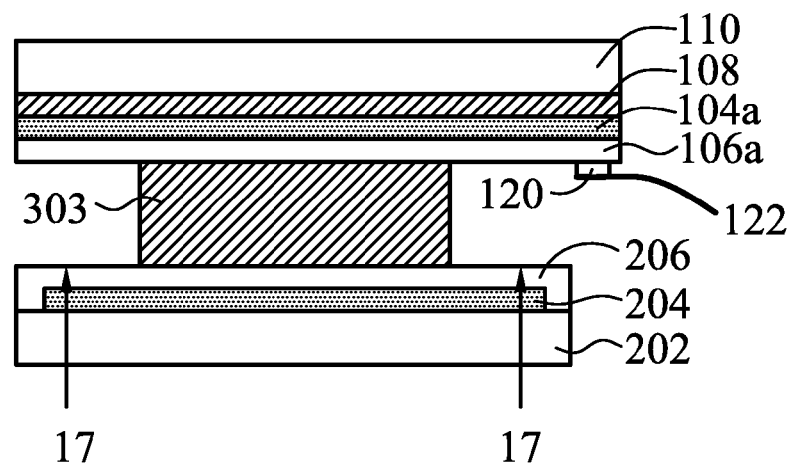

Referring to FIG. 2G, a second cutting step 17 is preformed to cut through the second de-bonding areas 204 and the second flexible substrate 206. The second de-bonding areas 204 are divided into a third portion 204a and a fourth portion 204b, and the second flexible substrate 206 is divided into a third portion 206a and a fourth portion 206b. The single flexible electronic device 303 is formed on the third portion 204a of the second de-bonding areas 204 and the third portion 206a of the second flexible substrate 206.

The second cutting step 17 comprises cutting the second de-bonding areas 204 and the second flexible substrate 206 by a laser beam or a knife wheel.

Figure 2H:
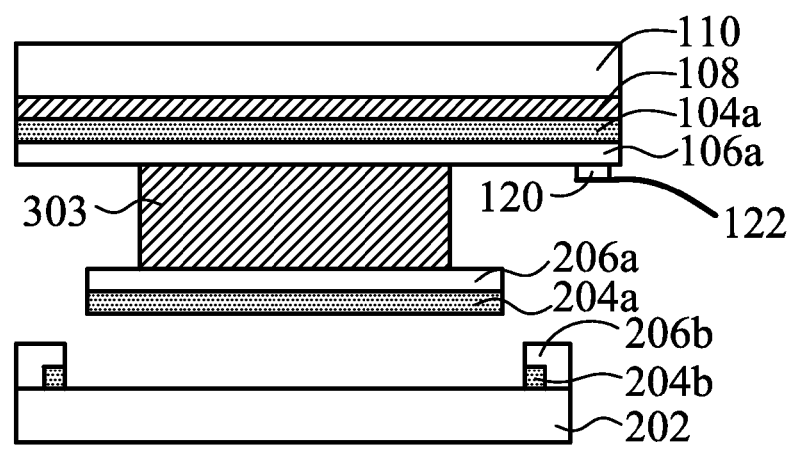

Referring to FIG. 2H, the second rigid carrier substrate 202 is separated from the third portion 204a of the second de-bonding areas 204. Then, the second rigid carrier substrate 202 is removed from the third portion 204a of the second de-bonding areas 204. Thus, the process method of the single flexible electronic device 303 is completed and the single flexible electronic device 303 is taken out of the two rigid carrier substrates.

In a modified embodiment of the second embodiment, one of the first rigid carrier substrate 102 and the second rigid carrier substrate 202 is a transparent substrate, and the other is a non-transparent substrate, such as metal substrate, or stainless steel substrate. When one of the two rigid carrier substrates is a transparent substrate, and the other is a non-transparent substrate, note that the cutting step is performed from the transparent substrate side.

FIGS. 3A-3D show cross-sectional schematic representations of various stages of fabricating a flexible electronic device in accordance with a third embodiment of the disclosure, wherein like elements are identified by the same reference numbers as in FIG. 1A-1F, and thus omitted for brevity.

Figure 3A:
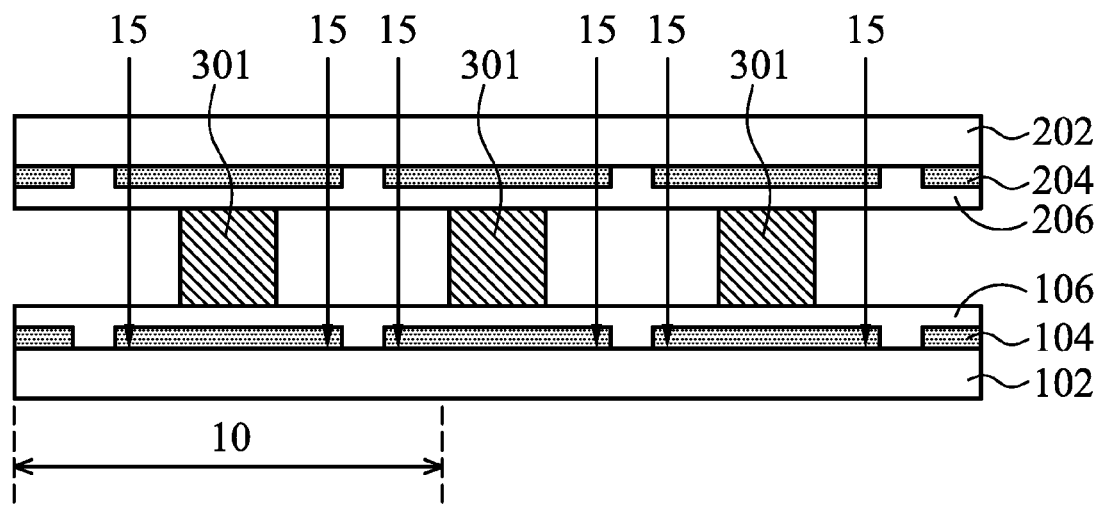
FIGS. 3A-3D show cross-sectional schematic representations of various stages of fabricating a flexible electronic device in accordance with a third embodiment of the disclosure.

Referring to FIG. 3A, a cutting step 15 is performed to cut through the first de-bonding areas 104, a first flexible substrate 106, the second de-bonding areas 204 and the second flexible substrate 206. The first de-bonding areas 104 are divided into a first portion 104a and a second portion 104b, the first flexible substrate 106 is divided into a first portion 106a and a second portion 106b, the second de-bonding areas 204 are divided into a third portion 204a and a fourth portion 204b, and the second flexible substrate 206 is divided into a third portion 206a and a fourth portion 206b. The flexible electronic device 301 is formed on the first portion 104a of the first de-bonding areas 104 and the first portion 106a of the first flexible substrate 106. The flexible electronic device 301 is formed on the third portion 204a of the second de-bonding areas 204 and the third portion 206a of the second flexible substrate 206.

The cutting step 15 is performed from the second rigid carrier substrate 206 like FIG. 3A. However, in other embodiments, the cutting step 15 may be preformed respectively from the first rigid carrier substrate 106 and from the second rigid carrier substrate 206.

Figure 3B:
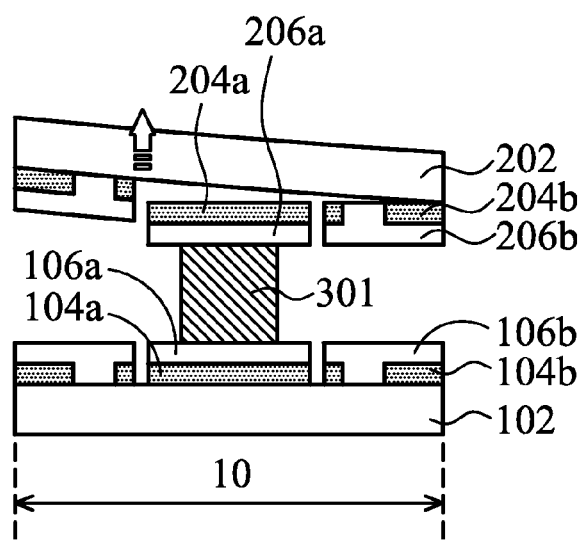

Then, referring to FIG. 3B, the second rigid carrier substrate 202 is separated from the third portion 204a of the second de-bonding areas 204.

In the third embodiment, the cutting step 15 cuts through the first de-bonding areas 104, the first flexible substrate 106, the second de-bonding areas 204 and the second flexible substrate 206, and the second rigid carrier substrate 202 is a bendable carrier substrate, so the peel strength of the second rigid carrier substrate 202 is larger than that of the first rigid carrier substrate 102 (the peel strength differences between the two rigid carrier substrates is larger than 5 g/inch). Thus, the second rigid carrier substrate 202 may be removed easily by applying a little force.

In another embodiment, if the first rigid carrier substrate 102 is a bendable rigid carrier substrate, it may be removed firstly.

Figure 3C:
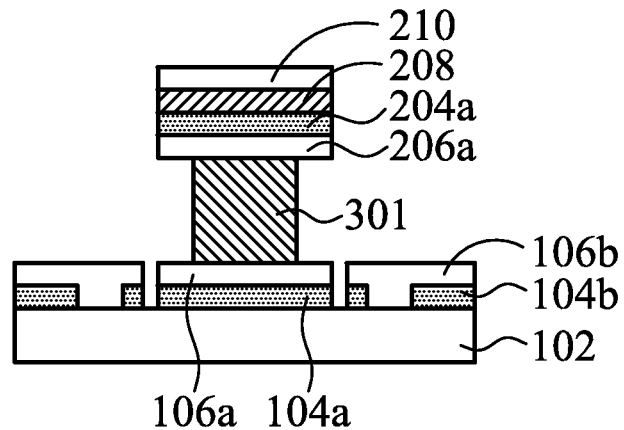

Referring to FIG. 3C, the second rigid carrier substrate 202 is removed from the third portion 204a of the second de-bonding areas 204 to expose the third portion 204a of the second de-bonding areas 204. A process method is performed to a surface of the third portion 204a of the second de-bonding areas 204. The process method comprises adhering the function layers 208, 210 on the surface of the third portion 204a of the second de-bonding areas 204. The function layers 108, 110 are described above, thus are omitted here for brevity.

Figure 3D:
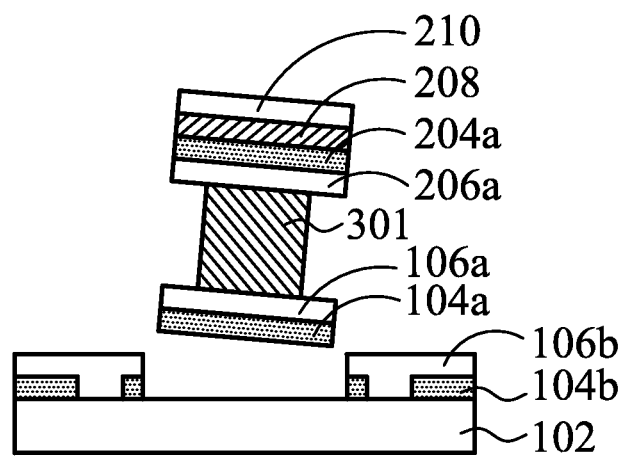

Referring to FIG. 3D, the first rigid carrier substrate 102 is separated from the first portion 104a of the first de-bonding areas 104 and the first rigid carrier substrate 102 is removed from the first portion 104a of the first de-bonding areas 104. Thus, the process method of the flexible electronic device 301 is completed and the flexible electronic device 301 is taken out of the two rigid carrier substrates.

In a modified embodiment of the third embodiment, one of the first rigid carrier substrate 102 and the second rigid carrier substrate 202 is a transparent substrate, and the other is a non-transparent substrate, such as metal substrate, or stainless steel substrate. When one of the two rigid carrier substrates is a transparent substrate, and the other is a non-transparent substrate, note that the cutting step is performed from the transparent substrate side.

FIGS. 4A-4E show cross-sectional schematic representations of various stages of fabricating a flexible electronic device in accordance with a fourth embodiment of the disclosure, wherein like elements are identified by the same reference numbers as in FIG. 3A-3D, and thus omitted for brevity. The difference between the fourth embodiment and the third embodiment is that a single flexible electronic device 303 is formed between the first rigid carrier substrate 102 and the second rigid carrier substrate 202 in the fourth embodiment.

Figure 4A:
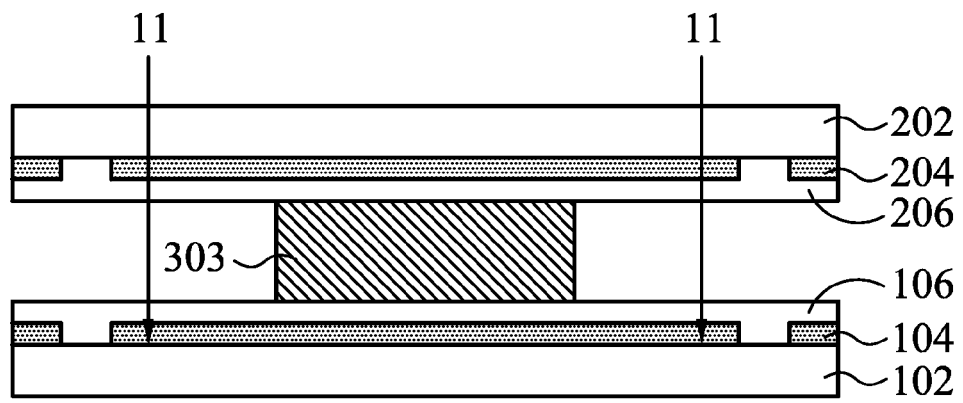
FIGS. 4A-4E show cross-sectional schematic representations of various stages of fabricating a flexible electronic device in accordance with a fourth embodiment of the disclosure.

Referring to FIG. 4A, the laser 11 cuts through the first de-bonding areas 104, the first flexible substrate 106, the second de-bonding areas 204 and the second flexible substrate 206. The first de-bonding areas 104 are divided into a first portion 104a and a second portion 104b, and the first flexible substrate 106 is divided into a first portion 106a and a second portion 106b. The second de-bonding areas 204 are divided into a third portion 204a and a fourth portion 204b, and the second flexible substrate 206 is divided into a third portion 206a and a fourth portion 206b. The single flexible electronic device 303 is formed on the first portion 104a of the first de-bonding areas 104 and the first portion 106a of the first flexible substrate 106. The single flexible electronic device 303 is formed on the third portion 204a of the second de-bonding areas 204 and the third portion 206a of the second flexible substrate 206.

Figure 4B:
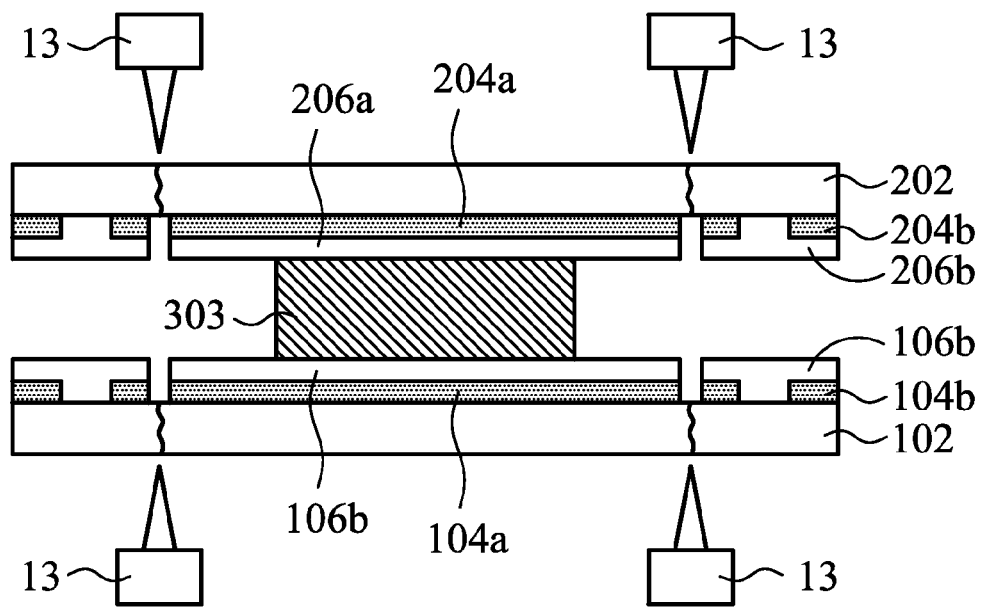

Then, referring to FIG. 4B, the first rigid carrier substrate 102 and the second rigid carrier substrate 202 are cut by a knife wheel 13 along a vertical direction between the first portion 104a of the first de-bonding areas 104 and the second portion 104b of first de-bonding areas 104, and between the third portion 204a of the second de-bonding areas 204 and the fourth portion 204b of second de-bonding areas 204. A breakage step is performed to form the single flexible electronic device 303 between the first rigid carrier substrate 102 and the second rigid carrier substrate 202 (as shown in FIG. 4C).

Figure 4C:
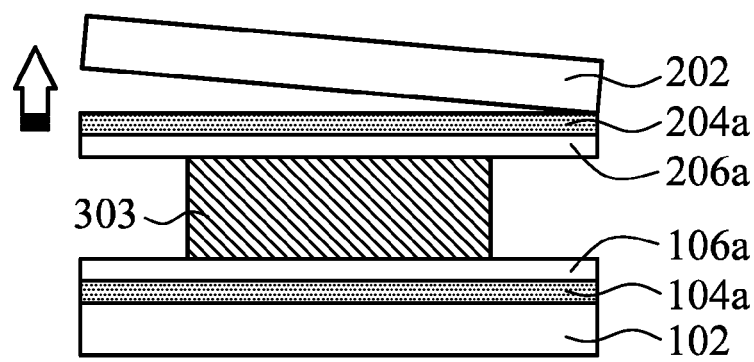

Referring to FIG. 4C, the second rigid carrier substrate 202 is separated from the third portion 204a of the second de-bonding areas 204. In one embodiment, the second rigid carrier substrate 202 is a bendable carrier substrate, and thus the second rigid carrier substrate 202 may be easily removed by applying a little force.

In FIG. 2A of the second embodiment, the laser 11 only cuts through the first flexible substrate 106 and the second flexible substrate 206, but not through the first de-bonding areas 104 and second de-bonding areas 104. Thus, in the following steps, the first cutting step 15 and the second cutting step 17 are used to remove the first rigid carrier substrate 102 and the second rigid carrier substrate 202, respectively.

In FIG. 4A of the fourth embodiment, the laser 11 cuts through the first de-bonding areas 104, the first flexible substrate 106, the second de-bonding areas 204 and the second flexible substrate 206, so the peel strength of the second rigid carrier substrate 202 is larger than that of the first rigid carrier substrate 102 (the peel strength differences between the two rigid carrier substrates is larger than 5 g/inch). Thus, the second rigid carrier substrate 202 may be removed easily by applying a little force.

Figure 4D:
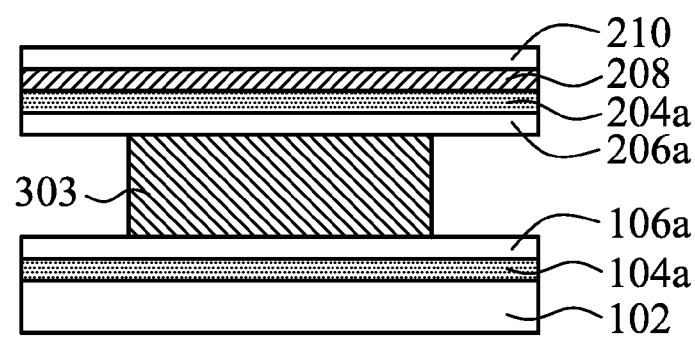

Referring to FIG. 4D, the second rigid carrier substrate 202 is removed from the third portion 204a of the second de-bonding areas 204 to expose a surface of the third portion 204a of the second de-bonding areas 204. Then, a process method is performed to the surface of the third portion 204a of the second de-bonding areas 204. The process method comprises adhering the function layers 208, 210 on a surface of the third portion 204a of the second de-bonding areas 204. The function layers 208, 210 are described above, this are omitted here for brevity.

Figure 4E:
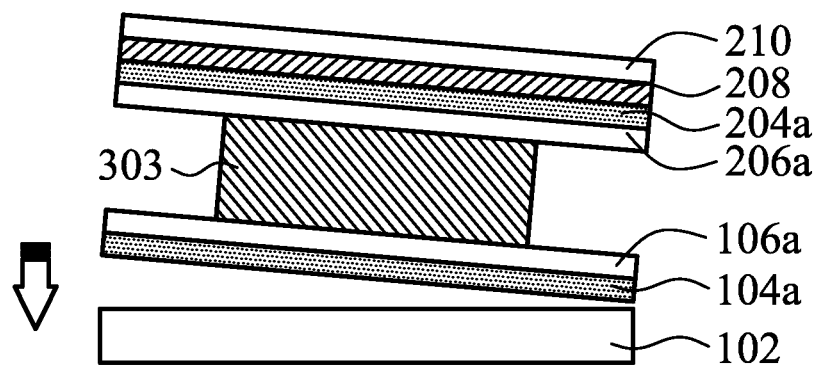

Referring to FIG. 4E, the first rigid carrier substrate 102 is separated from the first portion 104a of the first de-bonding areas 104 and the first rigid carrier substrate 102 is removed from the first portion 104a of the first de-bonding areas 104. Thus, the process method of the single flexible electronic device 303 is completed and the single flexible electronic device 303 is taken out of the two rigid carrier substrates.

FIGS. 5A-5K show cross-sectional schematic representations of various stages of fabricating a flexible electronic device in accordance with a fifth embodiment of the disclosure, wherein like elements are identified by the same reference numbers as in FIG. 1A-1F, and thus omitted for brevity.

Figure 5A:
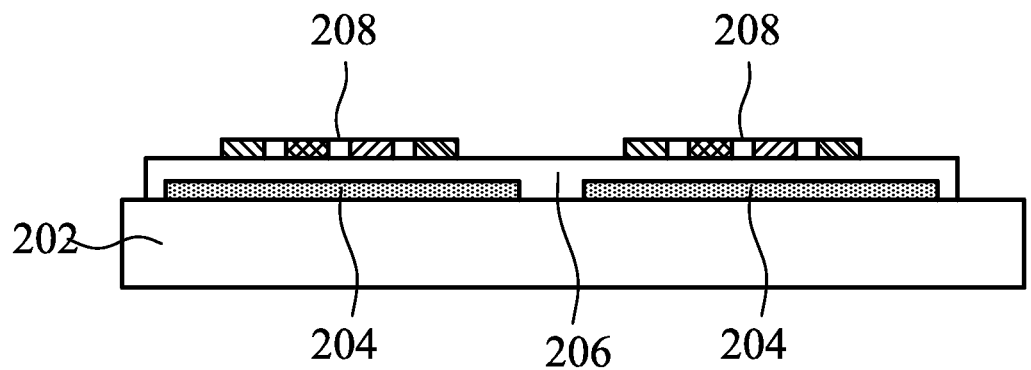
FIGS. 5A-5K show cross-sectional schematic representations of various stages of fabricating a flexible electronic device in accordance with a fifth embodiment of the disclosure.

Referring to FIG. 5A, a second rigid carrier substrate 202 is provided, wherein at least one second de-bonding area 204, a second flexible substrate 206 and a function layer 208 are formed on the second rigid carrier substrate 202. The function layer 208 comprises a color filter layer, or polarizer layer or the like.

Figure 5B:
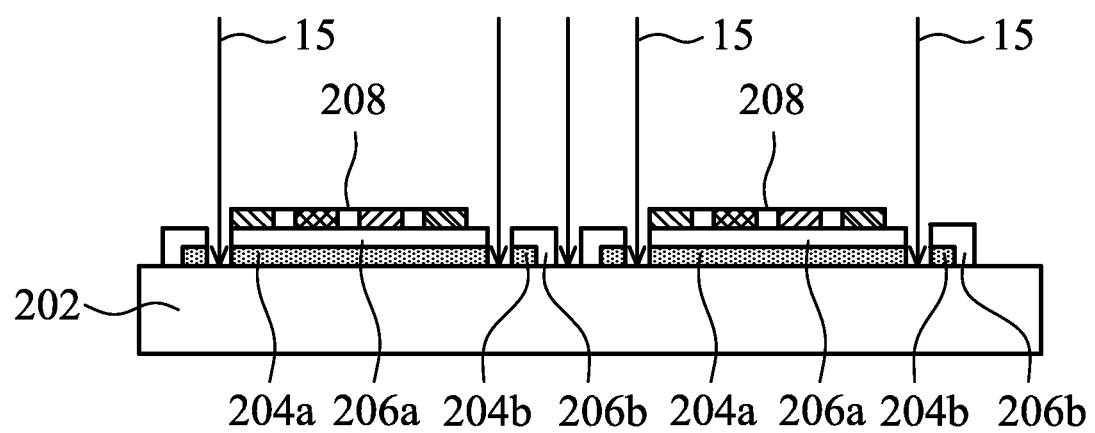

Referring to FIG. 5B, a first cutting step 15 is performed to cut through the second de-bonding area 204 and the second flexible substrate 206. The second de-bonding area 204 is divided into a first portion 204a and a second portion 204b, and the second flexible substrate 206 are divided into a first portion 206a and a second portion 206b. The first cutting step 15 comprises cutting the second de-bonding area 204 and the second flexible substrate 206 by a laser beam or a knife wheel.

Figure 5C:
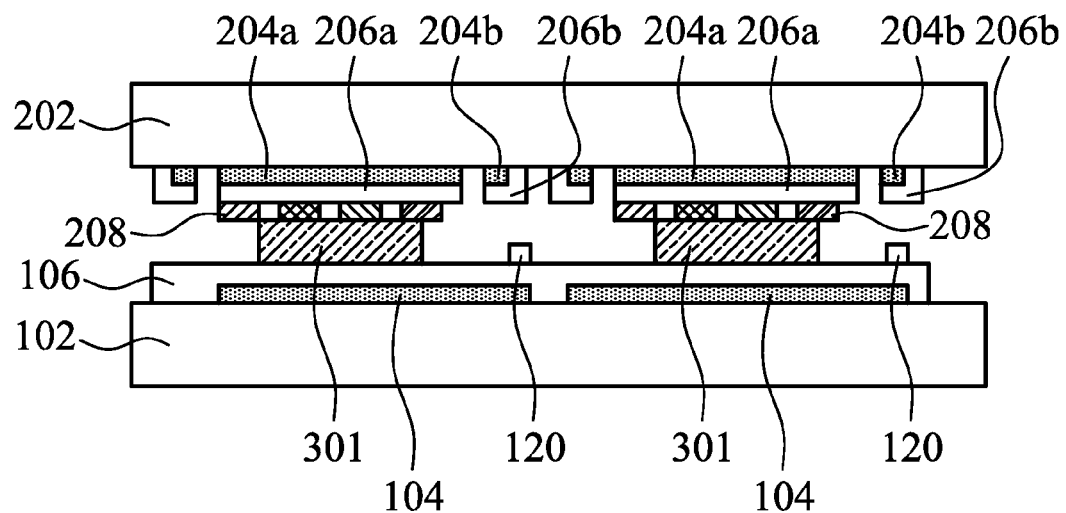

Referring FIG. 5C, a first rigid carrier substrate 102 is provided, wherein at least one first de-bonding area 104, a first flexible substrate 106 and a plurality of the flexible electronic devices 301 are formed on the first rigid carrier substrate 102. Then, the first rigid carrier substrate 102 and the second rigid carrier 202 are assembled.

In FIG. 5C, the flexible electronic devices 301 are formed on the first portion 204a of the second de-bonding area 204 and the first portion 206a of the second flexible substrate 206.

Figure 5D:
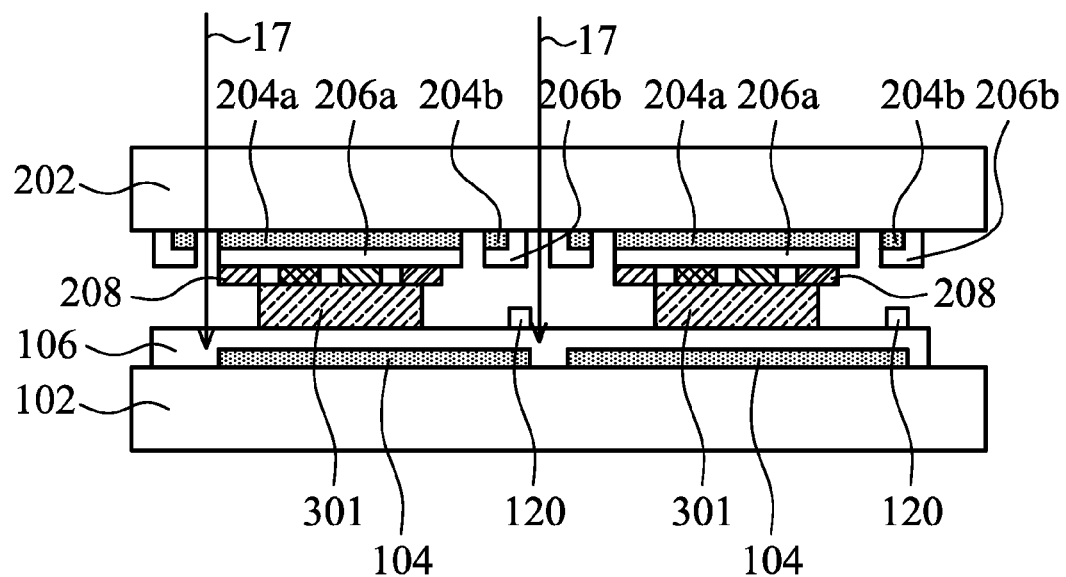

Referring to FIG. 5D, a second cutting step 17 is performed to cut through the first flexible substrate 106. The first flexible substrate 106 is divided into a third portion 106a and a fourth portion 106b, and the flexible electronic devices 301 are formed on the third portion 106a of the first flexible substrate 106. The second cutting step 17 comprises irradiating a laser beam to the first flexible substrate 106 through the second rigid carrier substrate 202.

Figure 5E:
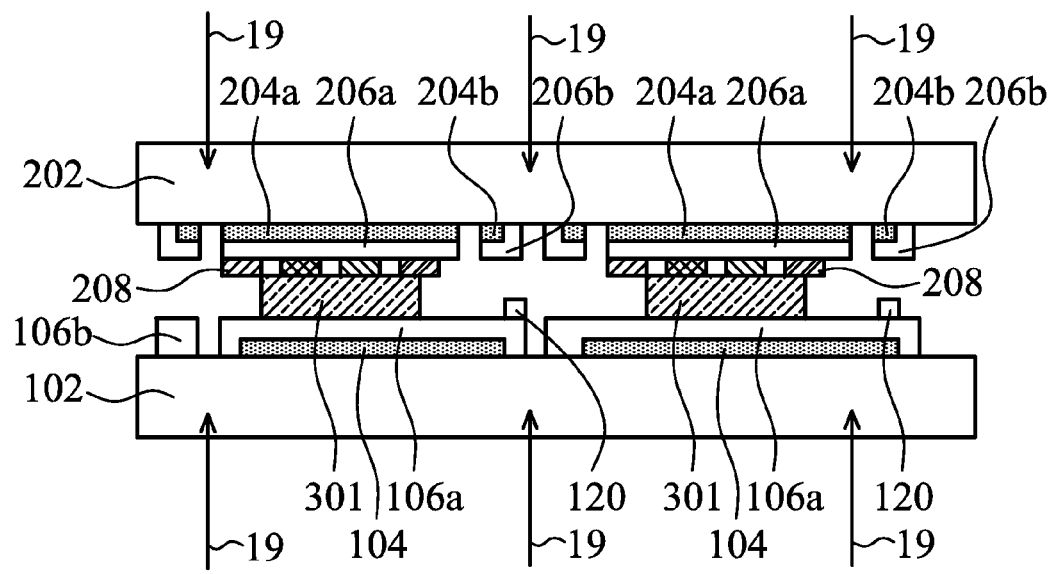

Referring to FIG. 5E, a third cutting step 19 is performed to cut through the first rigid carrier substrate 102 and the second rigid carrier substrate 202. The third cutting step 19 comprises cutting the first rigid carrier substrate 102 and the second rigid carrier substrate 202 by a laser beam or a knife wheel.

Figure 5F:
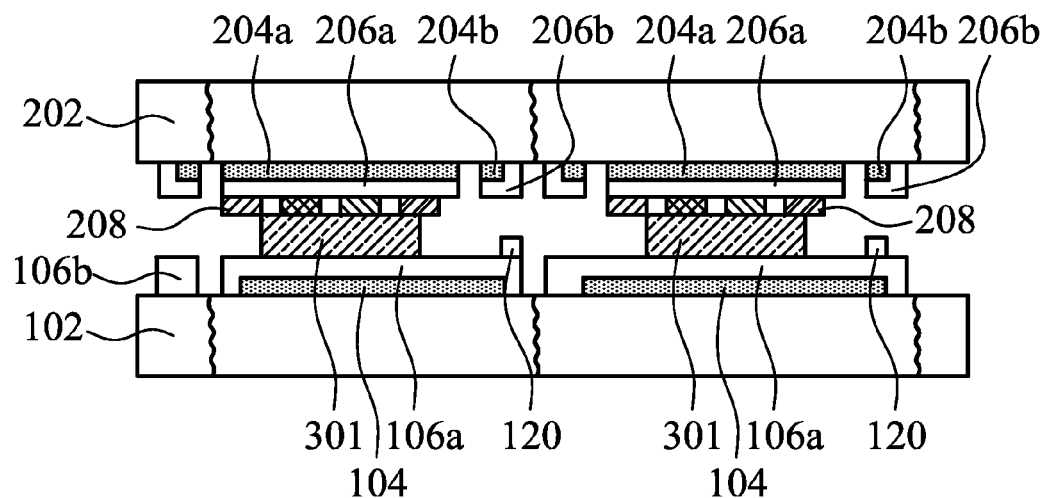

Referring to FIG. 5F, a breakage step is performed to form a single flexible electronic device 301 between the first rigid carrier substrate 102 and the second rigid carrier substrate 202.

Figure 5G:
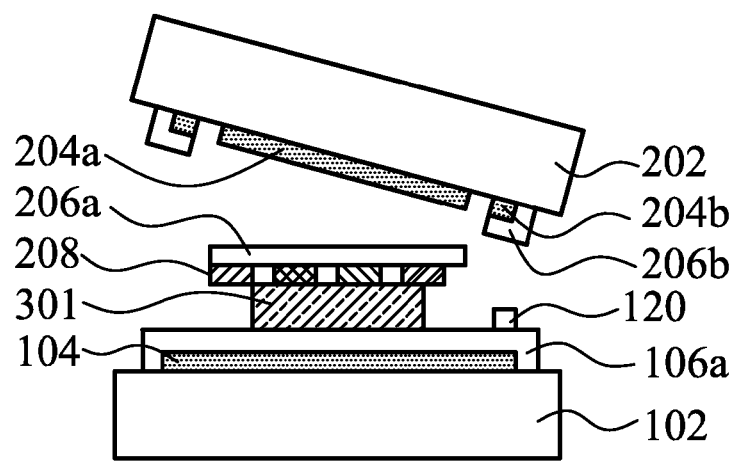

Referring to FIG. 5G, the second de-bonding area 204 is separated from the second flexible substrate 206 to expose a surface of the first portion 206a of the second flexible substrate 206.

Figure 5H:
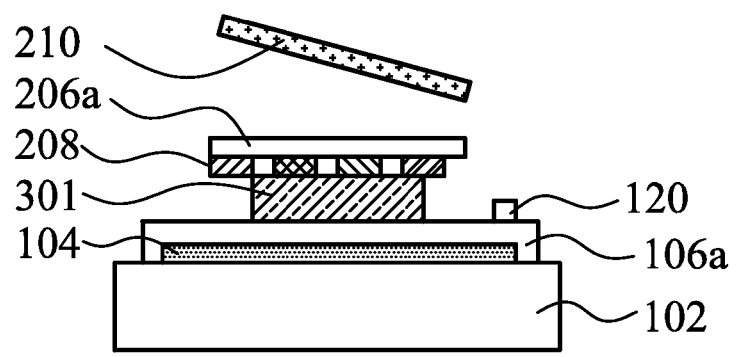

An optional step is performed. Referring to FIG. 5H, a process method is performed to the surface of the first portion 206a of the second flexible substrate 206. Thus, a function layer 210 (such as touch film, polarizer or the like) is formed on the surface of the first portion 206a of the second flexible substrate 206.

Figure 5I:
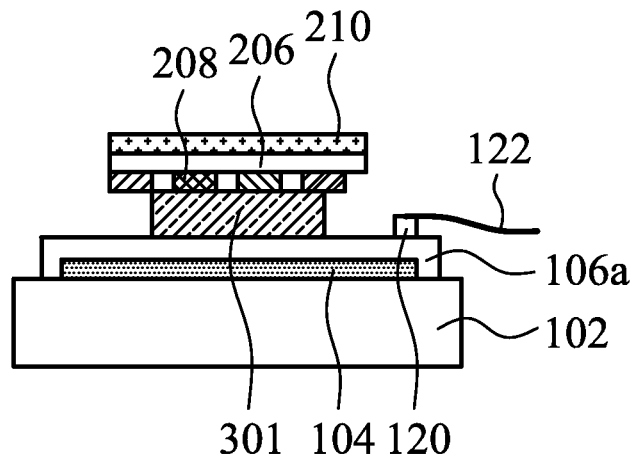

Referring FIG. 5C again, a pin 120 is formed on the first flexible substrate 106. The function of the pin 120 is to transfer the signal of the flexible electronic devices 301 to an external circuit. In FIG. 5I, the pin 120 is electrically connected to a flexible printed circuit board bonding (FPC bonding) 122. In another embodiment, the method continues to FIG. 5J without formation of the pin 122 and FPC bonding 122.

Figure 5J:
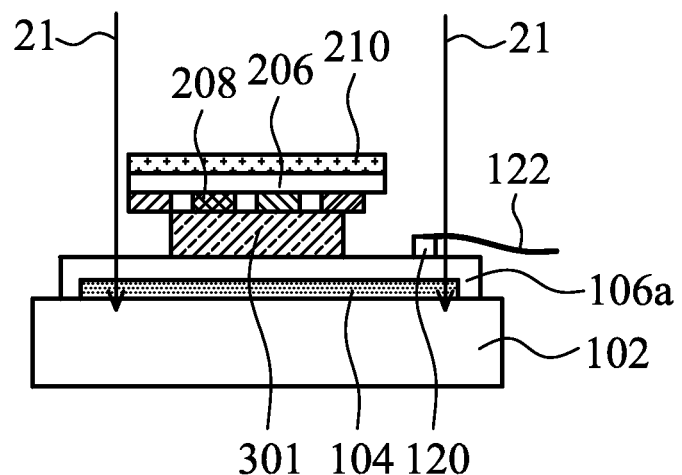

Referring to FIG. 5J, a fourth cutting step 21 is performed to cut through the first de-bonding area 104.

Figure 5K:
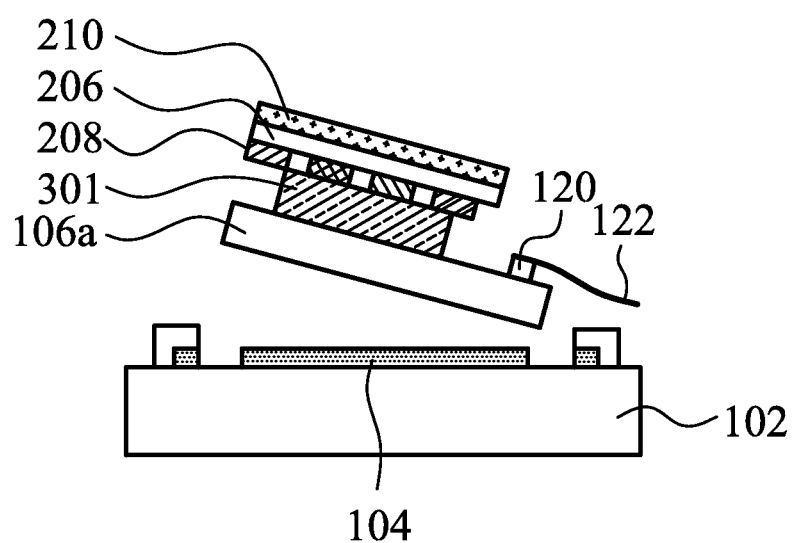

Referring to FIG. 5K, the first de-bonding area 104 is separated from the third portion 106a of the first flexible substrate 106. Thus, the process method of the flexible electronic device 301 is completed and the flexible electronic device 301 is taken out of the two rigid carrier substrates.

FIGS. 6A-6J show cross-sectional schematic representations of various stages of fabricating a flexible electronic device in accordance with a sixth embodiment of the disclosure, wherein like elements are identified by the same reference numbers as in FIG. 1A-1F, and thus omitted for brevity.

Figure 6A:
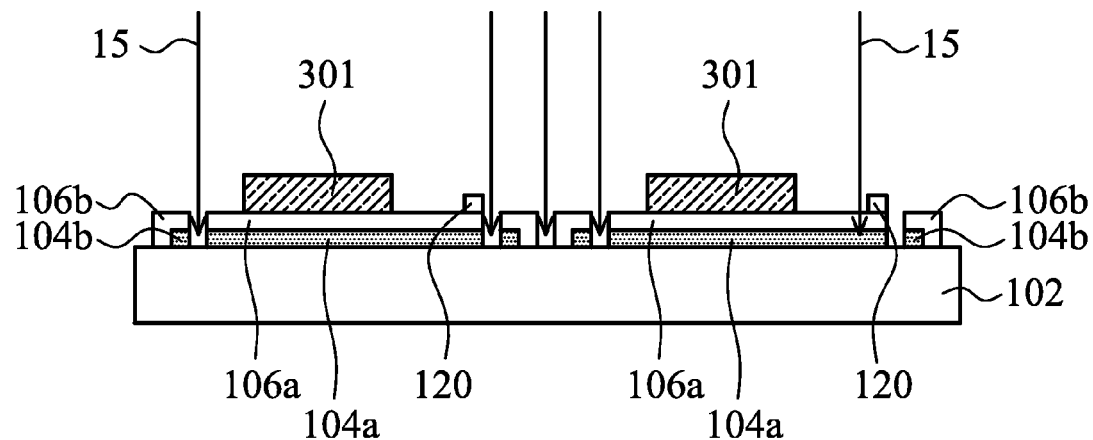
FIGS. 6A-6J show cross-sectional schematic representations of various stages of fabricating a flexible electronic device in accordance with a sixth embodiment of the disclosure.

Referring to FIG. 6A, a first rigid carrier substrate 102 is provided, wherein at least one first de-bonding area 104, a first flexible substrate 106 and a plurality of the flexible electronic devices 301 are formed on the first rigid carrier substrate 102.

Then, a first cutting step 15 is performed to cut through the first de-bonding areas 104 and the first flexible substrate 106. The first de-bonding area 104 is divided into a first portion 104a and a second portion 104b, and the first flexible substrate 106 is divided into a first portion 106a and a second portion 106b. The first cutting step 15 comprises irradiating a laser beam to the first de-bonding areas 104 and the first flexible substrate 106.

The flexible electronic devices 301 are formed on the first portion 104a of the first de-bonding area 104 and the first portion 106a of the first flexible substrate 106.

Figure 6B:
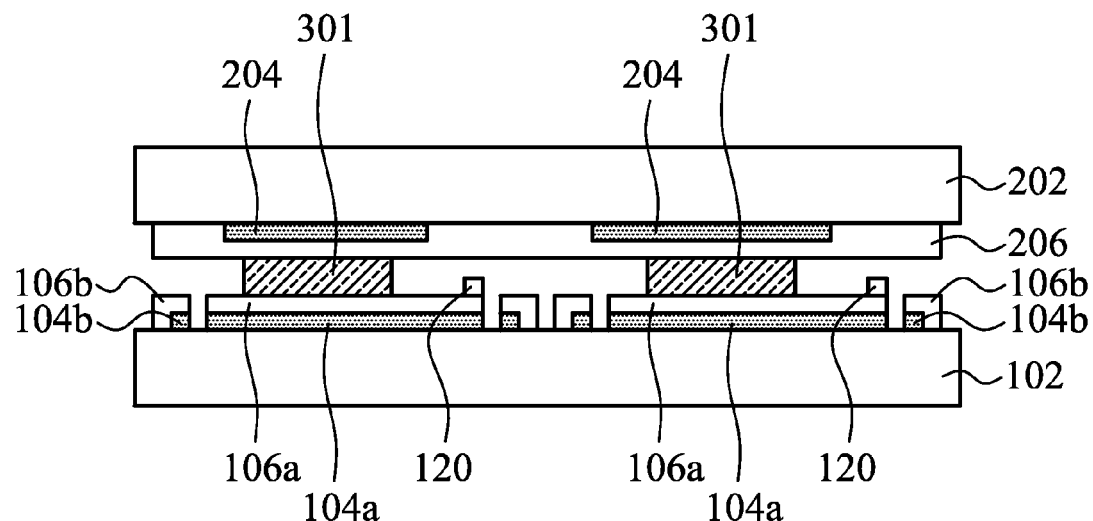

Referring to FIG. 6B, a second rigid carrier substrate 202 is provided, wherein at least one second de-bonding area 204, and a second flexible substrate 206 are formed on the second rigid carrier substrate 202.

The first rigid carrier substrate 102 and the second rigid carrier substrate 202 are assembled.

Figure 6C:
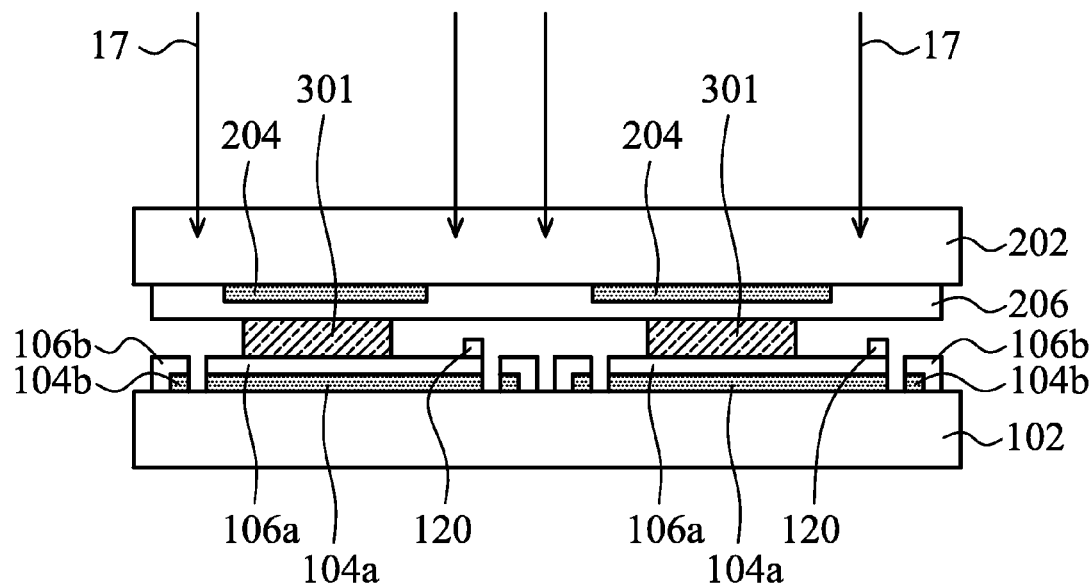

Referring to FIG. 6C, a second cutting step 17 is performed to cut through the second flexible substrate 206. The second flexible substrate 206 is divided into a third portion 206a and a fourth portion 206b, and the flexible electronic devices 301 are formed on the third portion 206a of the second flexible substrate 206. The second cutting step 17 comprises irradiating a laser beam to the second flexible substrate 206 through second rigid carrier substrate 202.

Figure 6D:
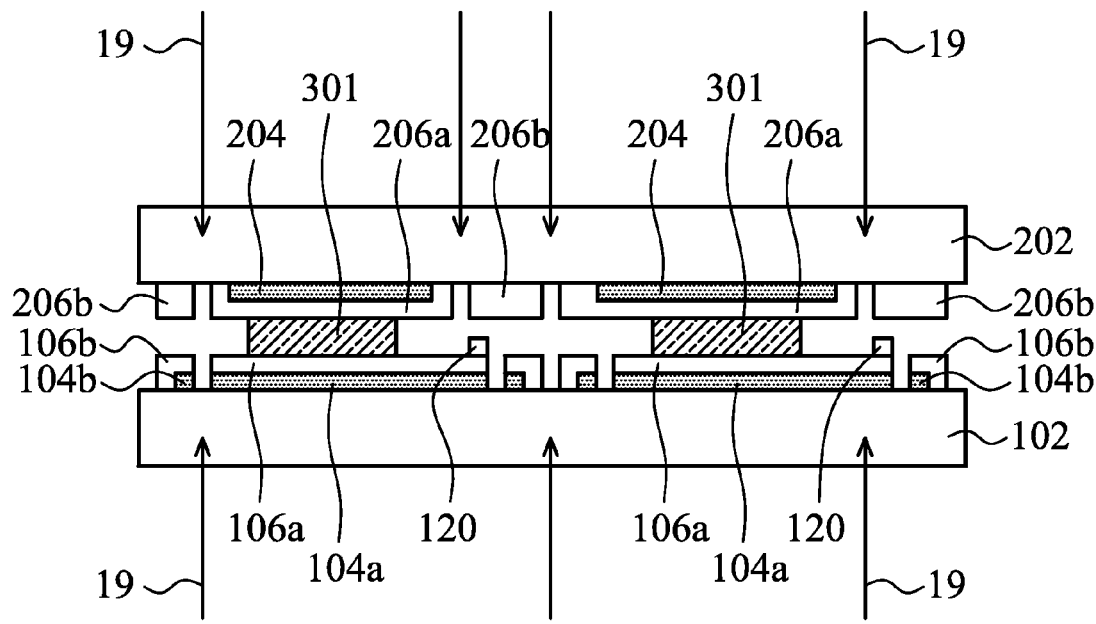

Referring to FIG. 6D, a third cutting step 19 is performed to cut through the first rigid carrier substrate 102 and the second rigid carrier substrate 202. The third cutting step 19 comprises cutting the first rigid carrier substrate 102 and the second rigid carrier substrate 202 by a laser beam or a knife wheel.

Figure 6E:
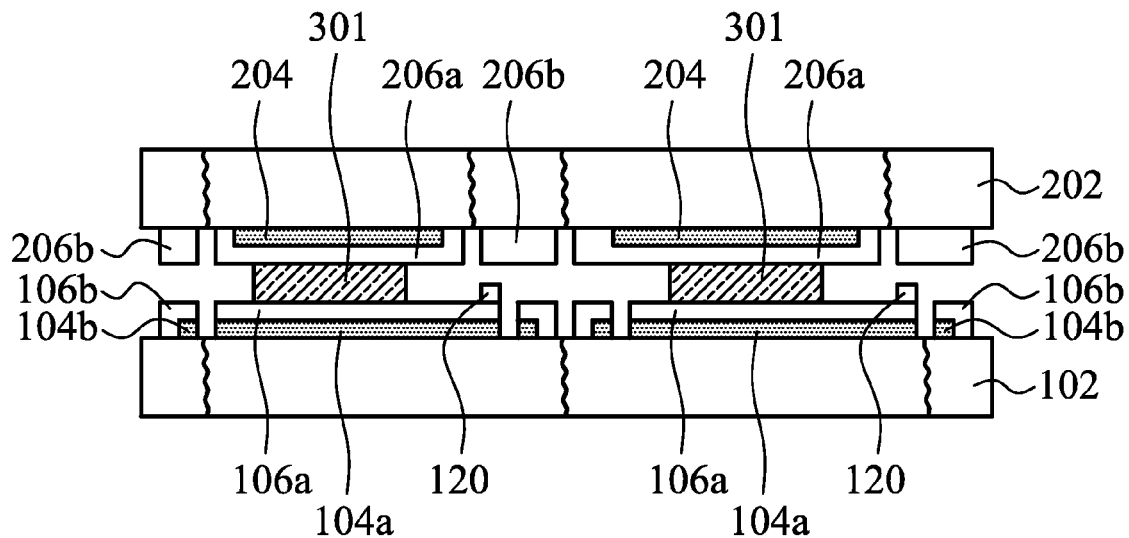

Referring to FIG. 6E, a breakage step is performed to form a single flexible electronic device 301 between the first rigid carrier substrate 102 and the second rigid carrier substrate 202.

Figure 6F:
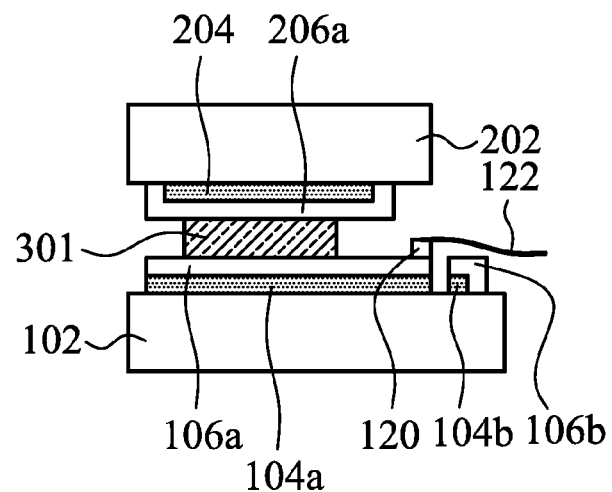

In FIG. 6A, a pin 120 is formed on the first flexible substrate 106. The function of the pin 120 is to transfer the signal of the flexible electronic devices 301 to an external circuit. In FIG. 6F, the pin 120 is electrically connected to a flexible printed circuit board bonding (FPC bonding) 122. In another embodiment, the method continues to FIG. 6G without formation of the pin 122 and FPC bonding 122.

Figure 6G:
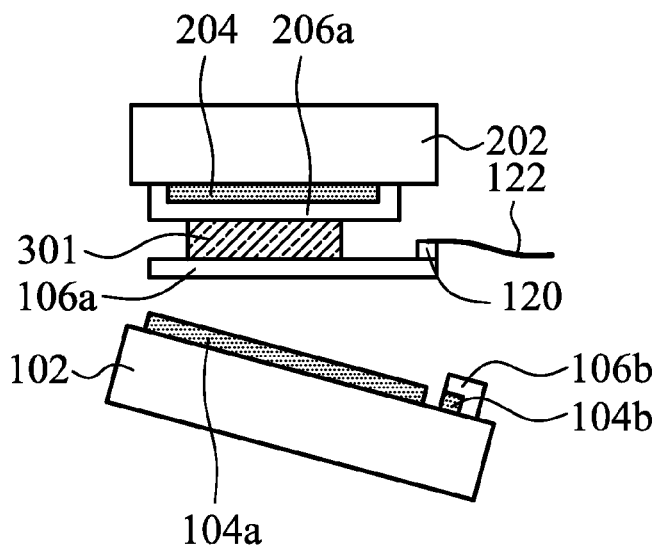

Referring to FIG. 6G, the first de-bonding area 104 is separated from the first flexible substrate 106 to expose a surface of the first portion 106a of the first flexible substrate 106

Figure 6H:
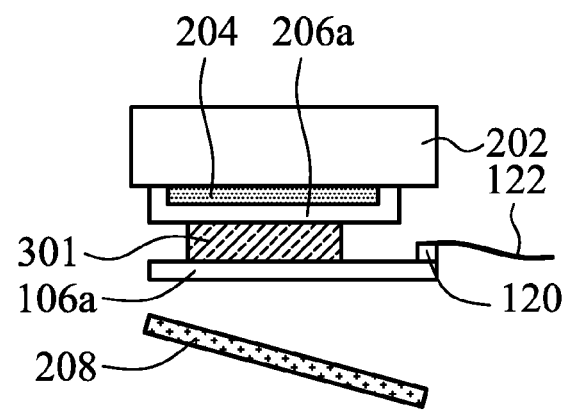

An optional step is performed. Referring to FIG. 6H, a process method is performed to the surface of the first portion 106a of the first flexible substrate 106. Thus, a function layer 208 (such as touch film, polarizer or the like) is formed on the surface of the first portion 106a of the first flexible substrate 106.

Figure 6I:
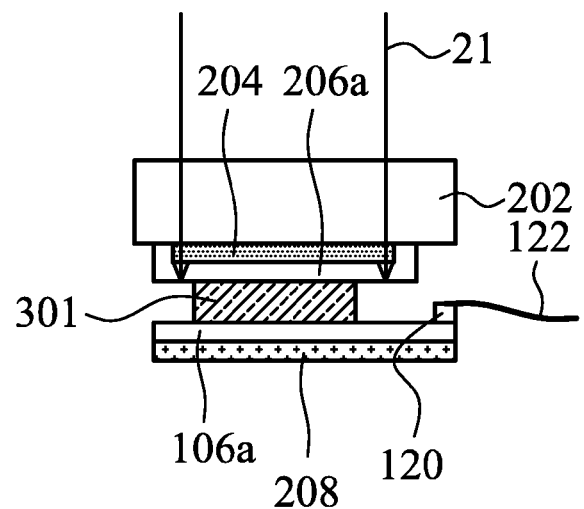

Referring to FIG. 6I, a fourth cutting step 21 is performed to cut through the second de-bonding area 204. The fourth cutting step 21 comprises irradiating a laser beam to the third portion 206a of the second flexible substrate 206.

Figure 6J:
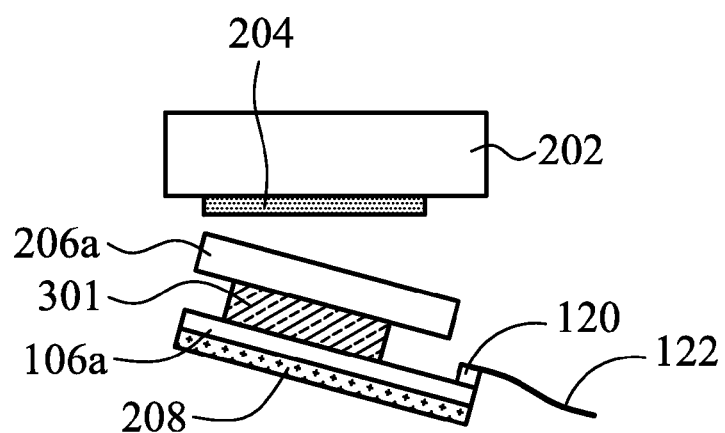

Referring to FIG. 6J, the second de-bonding area 204 is separated from the second flexible substrate 206. Thus, the process method of the flexible electronic device 301 is completed and the flexible electronic device 301 is taken out of the two rigid carrier substrates.

From the above-mentioned descriptions, the disclosure provides six embodiments for fabricating the flexible electronic device. The method comprise a cutting step from one side (such as the first embodiment or the second embodiment) or from two sides (such as the third embodiment or the fourth embodiment).

A single flexible electronic device is firstly obtained (such as the second embodiment or the fourth embodiment) by a series of cutting steps, and then the processing step is then performed.

The first rigid carrier substrate and the second rigid carrier substrate are fabricated, respectively, and then the first rigid carrier substrate and the second rigid carrier substrate are assembled (such as fifth embodiment or sixth embodiment). The cutting steps and the processing steps are performed While the disclosure has been described by way of example and in terms of the embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating the flexible electronic devices, comprising:

providing a first rigid carrier substrate and a second rigid carrier substrate disposed oppositely to each other, wherein at least one flexible electronic device is formed between the first rigid carrier substrate and the second rigid carrier substrate, and a plurality of first de-bonding areas, a first flexible substrate, the flexible electronic device, a second flexible substrate, a plurality of second de-bonding areas and the second rigid carrier substrate are formed on the first rigid carrier substrate;

performing a first cutting step to cut through the first de-bonding areas, wherein the first de-bonding areas are divided into a first portion and a second portion, and the flexible electronic device is formed on the first portion of the first de-bonding areas;

separating the first rigid carrier substrate from the first portion of the first de-bonding areas;

removing the first rigid carrier substrate from the first portion of the first de-bonding areas to expose the first portion of the first de-bonding areas; and performing a second cutting step to cut through the second de-bonding areas, wherein the second de-bonding areas are divided into a third portion and a fourth portion, and the flexible electronic device is formed on the third portion of the second de-bonding areas;

separating the second rigid carrier substrate from the third portion of the second de-bonding areas; and removing the second rigid carrier substrate from the third portion of the second de-bonding areas.

2. The method for fabricating the flexible electronic devices as claimed in claim 1, wherein the first rigid carrier substrate and the second rigid carrier substrate independently comprise a glass substrate, silicon substrate, quartz substrate or sapphire substrate.

3. The method for fabricating the flexible electronic devices as claimed in claim 1, wherein the first rigid carrier substrate and the second rigid carrier substrate are both transparent carrier substrates or either one is a transparent carrier substrate and the other is a non-transparent carrier substrate.

4. The method for fabricating the flexible electronic devices as claimed in claim 1, wherein the first rigid carrier substrate, the second rigid carrier substrate or both are bendable carrier substrates.

5. The method for fabricating the flexible electronic devices as claimed in claim 1, before performing the first cutting step, further comprising:
providing a single flexible electronic device between the first rigid carrier substrate and the second rigid carrier substrate, wherein the formation of the single flexible electronic device comprises:
cutting through the first flexible substrate and the second flexible substrate by a laser beam along an outer peripheral portion of the single flexible electronic device, wherein a first breakage opening is formed in the first flexible substrate and a second breakage opening is formed in the second flexible substrate;
cutting the first rigid carrier substrate and the second rigid carrier substrate by a knife wheel along a vertical direction of the first breakage opening and the second breakage opening; and
performing a breakage step to form the single flexible electronic device between the first rigid carrier substrate and the second rigid carrier substrate.

6. The method for fabricating the flexible electronic devices as claimed in claim 1, wherein the first cutting step comprises:
irradiating a laser beam to the first de-bonding areas and the first flexible substrate through the first rigid carrier substrate.

7. The method for fabricating the flexible electronic devices as claimed in claim 1, before performing the second cutting step, further comprising:
processing a surface of the first portion of the first de-bonding areas.

8. The method for fabricating the flexible electronic devices as claimed in claim 1, wherein the second cutting step comprises:
cutting the second de-bonding areas and the second flexible substrate by a laser beam or a knife wheel.

9. The method for fabricating the flexible electronic devices as claimed in claim 1, wherein the first cutting step further comprises:
cutting through the first flexible substrate to divide the first flexible substrate into a first portion and a second portion, wherein the flexible electronic device is formed on the first portion of the first flexible substrate.

10. The method for fabricating the flexible electronic devices as claimed in claim 1, wherein the second cutting step further comprises:
cutting through the second flexible substrate to divide the second flexible substrate into a third portion and a fourth portion, wherein the flexible electronic device is formed on the third portion of the second flexible substrate.

11. A method for fabricating the flexible electronic devices, comprising:
providing a first rigid carrier substrate and a second rigid carrier substrate disposed oppositely to each other, wherein at least one flexible electronic device is formed between the first rigid carrier substrate and the second rigid carrier substrate, and a plurality of first de-bonding areas, a first flexible substrate, the flexible electronic device, a second flexible substrate, a plurality of second de-bonding areas and the second rigid carrier substrate are formed on the first rigid carrier substrate;
performing a cutting step to cut through the first de-bonding areas and the second de-bonding areas, wherein the first de-bonding areas are divided into a first portion and a second portion, the second de-bonding areas are divided into a third portion and a fourth portion, and the flexible electronic device is formed on the first portion of the first de-bonding areas and the third portion of the second de-bonding areas;
separating the second rigid carrier substrate from the third portion of the second de-bonding areas;
removing the second rigid carrier substrate from the third portion of the second de-bonding areas to expose the third portion of the second de-bonding areas;
separating the first rigid carrier substrate from the first portion of the first de-bonding areas; and
removing the first rigid carrier substrate from the first portion of the first de-bonding areas.

12. The method for fabricating the flexible electronic devices as claimed in claim 11, before separating the first rigid carrier substrate from the first portion of the first de-bonding areas, further comprising:
processing a surface of the third portion of the second de-bonding areas.

13. The method for fabricating the flexible electronic devices as claimed in claim 11, wherein the first rigid carrier substrate and the second rigid carrier substrate are both transparent carrier substrates or either one is a transparent carrier substrate and the other is a non-transparent carrier substrate.

14. The method for fabricating the flexible electronic devices as claimed in claim 11, wherein the first rigid carrier substrate, the second rigid carrier substrate or both are bendable carrier substrates.

15. The method for fabricating the flexible electronic devices as claimed in claim 11, wherein the cutting step is along an outer peripheral portion of the single flexible electronic device and comprises:
cutting the first rigid carrier substrate and the second rigid carrier substrate by a knife wheel along a vertical direction between the first portion and second portion of the first de-bonding areas, and along a vertical direction between the third portion and fourth portion of the second de-bonding areas;
performing a breakage step to form the single flexible electronic device between the first rigid carrier substrate and the second rigid carrier substrate.

16. The method for fabricating the flexible electronic devices as claimed in claim 11, wherein the cutting step comprises:
irradiating a laser beam to the first de-bonding areas, the first flexible substrate, the second de-bonding areas and the second flexible substrate.

17. The method for fabricating the flexible electronic devices as claimed in claim 11, wherein the cutting step further comprises:
cutting through the first flexible substrate to divide the first flexible substrate into a first portion and a second portion; and
cutting through the second flexible substrate to divide the second flexible substrate into a third portion and a fourth portion, wherein the flexible electronic device is formed on the first portion of the first flexible substrate and the third portion of the second flexible substrate.

18. A method for fabricating the flexible electronic devices, comprising:
providing a second rigid carrier substrate, wherein at least one second de-bonding area, a second flexible substrate and a function layer are formed on the second rigid carrier substrate;

performing a first cutting step to cut through the second de-bonding areas and the second flexible substrate, wherein the second de-bonding areas are divided into a first portion and a second portion, and the second flexible substrate is divided into a first portion and a second portion;

providing a first rigid carrier substrate, wherein at least one first de-bonding area, a first flexible substrate and a plurality of the flexible electronic devices are formed on the first rigid carrier substrate;

assembling the first rigid carrier substrate to the second rigid carrier;

performing a second cutting step to cut through the first flexible substrate, wherein the first flexible substrate is divided into a third portion and a fourth portion, and the flexible electronic device is formed on the third portion of the first flexible substrate;

performing a third cutting step to cut through the first rigid carrier substrate and the second rigid carrier substrate;

performing a breakage step to form a single flexible electronic device between the first rigid carrier substrate and the second rigid carrier substrate;

separating the second de-bonding areas from the second flexible substrate to expose a surface of the first portion of the second flexible substrate;

performing a fourth cutting step to cut through the first de-bonding area; and separating the first de-bonding area from the third portion of the first flexible substrate.

19. The method for fabricating the flexible electronic devices as claimed in claim 18, after separating the second de-bonding areas from the second flexible substrate, further comprising:

processing a surface of the first portion of the second flexible substrate.

20. The method for fabricating the flexible electronic devices as claimed in claim 18, further comprising:

forming a pin on the first flexible substrate; and electrically connecting the pin to a flexible printed circuit board bonding (FPC bonding) after separating the second de-bonding areas from the second flexible substrate.

21. The method for fabricating the flexible electronic devices as claimed in claim 18, wherein the first cutting step comprises:

cutting the second de-bonding areas and the second flexible substrate by a laser beam or a knife wheel to cut through the second de-bonding areas and the second flexible substrate.

22. The method for fabricating the flexible electronic devices as claimed in claim 18, wherein the second cutting step comprises:

irradiating a laser beam to the first flexible substrate through the second rigid carrier substrate.

23. The method for fabricating the flexible electronic devices as claimed in claim 18, wherein the third cutting step comprises:

cutting through the first rigid carrier substrate and the second rigid carrier substrate by a laser beam or a knife wheel.

24. A method for fabricating the flexible electronic devices, comprising:

providing a first rigid carrier substrate, wherein at least one first de-bonding area, a first flexible substrate and a plurality of the flexible electronic devices are formed on the first rigid carrier substrate;

performing a first cutting step to cut through the first de-bonding areas and the first flexible substrate, wherein the first de-bonding area is divided into a first portion and a second portion, and the first flexible substrate is divided into a first portion and a second portion;

providing a second rigid carrier substrate, wherein at least one second de-bonding area, and a second flexible substrate are formed on the second rigid carrier substrate;

assembling the first rigid carrier substrate to the second rigid carrier substrate;

performing a second cutting step to cut through the second flexible substrate, wherein the second flexible substrate is divided into a third portion and a fourth portion, and the flexible electronic devices are formed on the third portion of the second flexible substrate;

performing a third cutting step to cut through the first rigid carrier substrate and the second rigid carrier substrate;

performing a breakage step to form a single flexible electronic device between the first rigid carrier substrate and the second rigid carrier substrate;

separating the first de-bonding area from the first flexible substrate to expose a surface of the first portion of the first flexible substrate;

performing a fourth cutting step to cut through the second de-bonding area; and separating the second de-bonding area from the second flexible substrate.

25. The method for fabricating the flexible electronic devices as claimed in claim 24, further comprising:

forming a pin on the first flexible substrate; and electrically connecting the pin to a flexible printed circuit board bonding (FPC bonding) after the breakage step.

26. The method for fabricating the flexible electronic devices as claimed in claim 24, after separating the first de-bonding area from the first flexible substrate, further comprising:

processing a surface of the first portion of the second flexible substrate.

* * * * *